United States Patent

Odake et al.

[11] Patent Number: 5,500,379
[45] Date of Patent: Mar. 19, 1996

[54] METHOD OF MANUFACTURING SEMICONDUCTOR DEVICE

[75] Inventors: Yoshinori Odake; Teruhito Ohnishi, both of Osaka; Minoru Fujii, Hyogo, all of Japan

[73] Assignee: Matsushita Electric Industrial Co., Ltd., Osaka, Japan

[21] Appl. No.: 265,104

[22] Filed: Jun. 24, 1994

[30] Foreign Application Priority Data

Jun. 25, 1993 [JP] Japan ............................ 5-155089

[51] Int. Cl.$^6$ ................. H01L 21/265; H01L 21/8238
[52] U.S. Cl. ..................... 437/34; 437/44; 437/56; 437/57; 437/35; 148/DIG. 82
[58] Field of Search ..................... 437/34, 44, 45, 437/56, 57, 29, 35, 913

[56] References Cited

U.S. PATENT DOCUMENTS

| | | | |
|---|---|---|---|
| 4,649,629 | 3/1987 | Miller et al. | 437/29 |
| 4,908,327 | 3/1990 | Chapman | 437/57 |
| 5,170,232 | 12/1992 | Narita | 437/44 |
| 5,171,700 | 12/1992 | Zamanian | 437/44 |
| 5,278,441 | 1/1994 | Kang et al. | 437/34 |
| 5,283,200 | 2/1994 | Okamoto | 437/57 |
| 5,320,974 | 6/1994 | Hori et al. | 437/44 |
| 5,328,862 | 7/1994 | Goo | 437/44 |

FOREIGN PATENT DOCUMENTS 2-22862  1/1990  Japan.

*Primary Examiner*—Tuan H. Nguyen
*Attorney, Agent, or Firm*—Willian Brinks Hofer Gilson & Lione

[57] ABSTRACT

In a CMOS semiconductor device, low-dose ion implant of p-type impurity and n-type impurity is successively conducted to both n-MOSFET and p-MOSFET after formation of gate electrodes. Thereafter, when source/drain regions are formed at each MOSFET, $p^-$ regions function as local punch through stoppers in the n-MOSFET and $n^-$ regions function as the local punch through stoppers in the p-MOSFET. At this time, respective doses of n-type and p-type impurities are adjusted so that lowerings of threshold values of the channel regions are almost equal to each other. Thus, short channel effect is prevented, while reducing the step of forming two resist masks. With side walls, the CMOS semiconductor device with less short channel effect and high durability to hot carrier is manufactured without increase in the step of forming the resist masks.

9 Claims, 22 Drawing Sheets

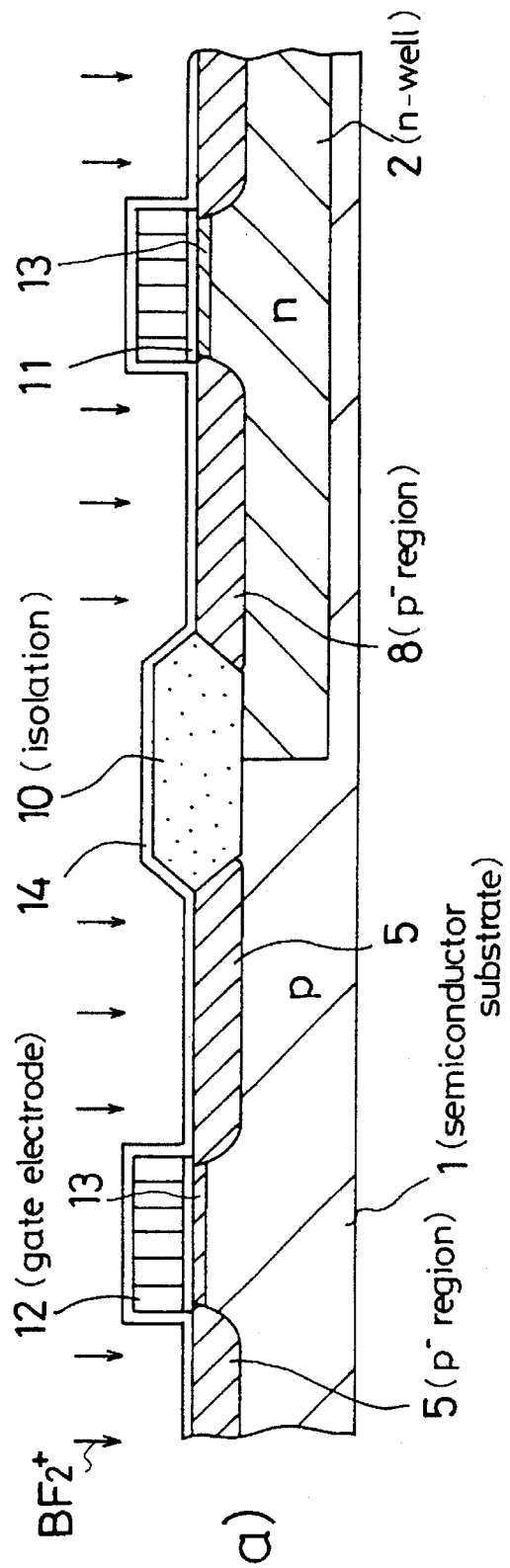
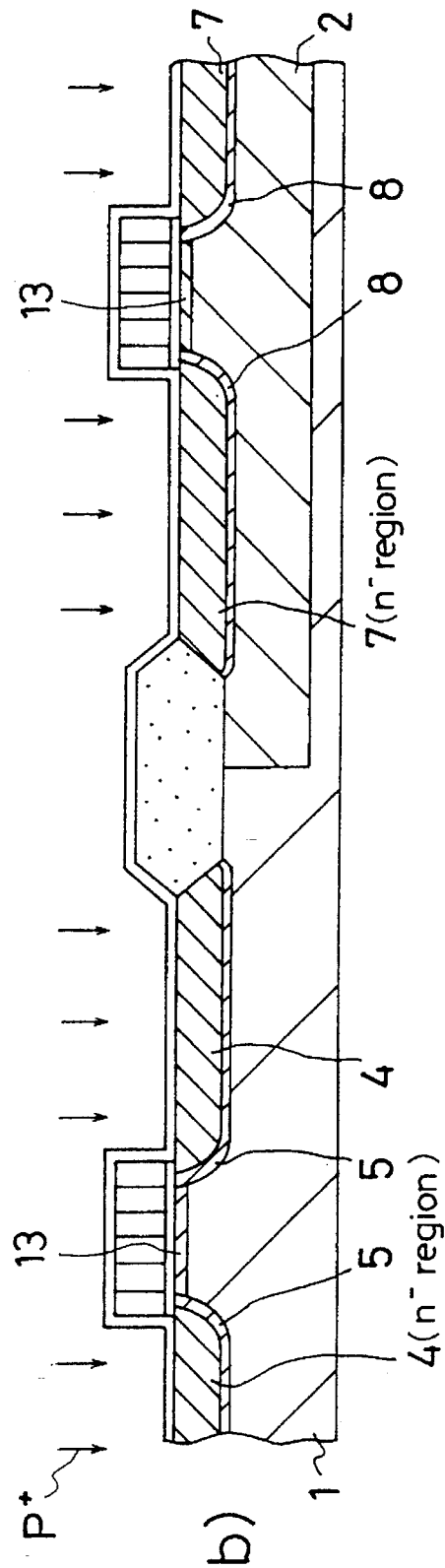
Fig.1(a)
Fig.1(b)

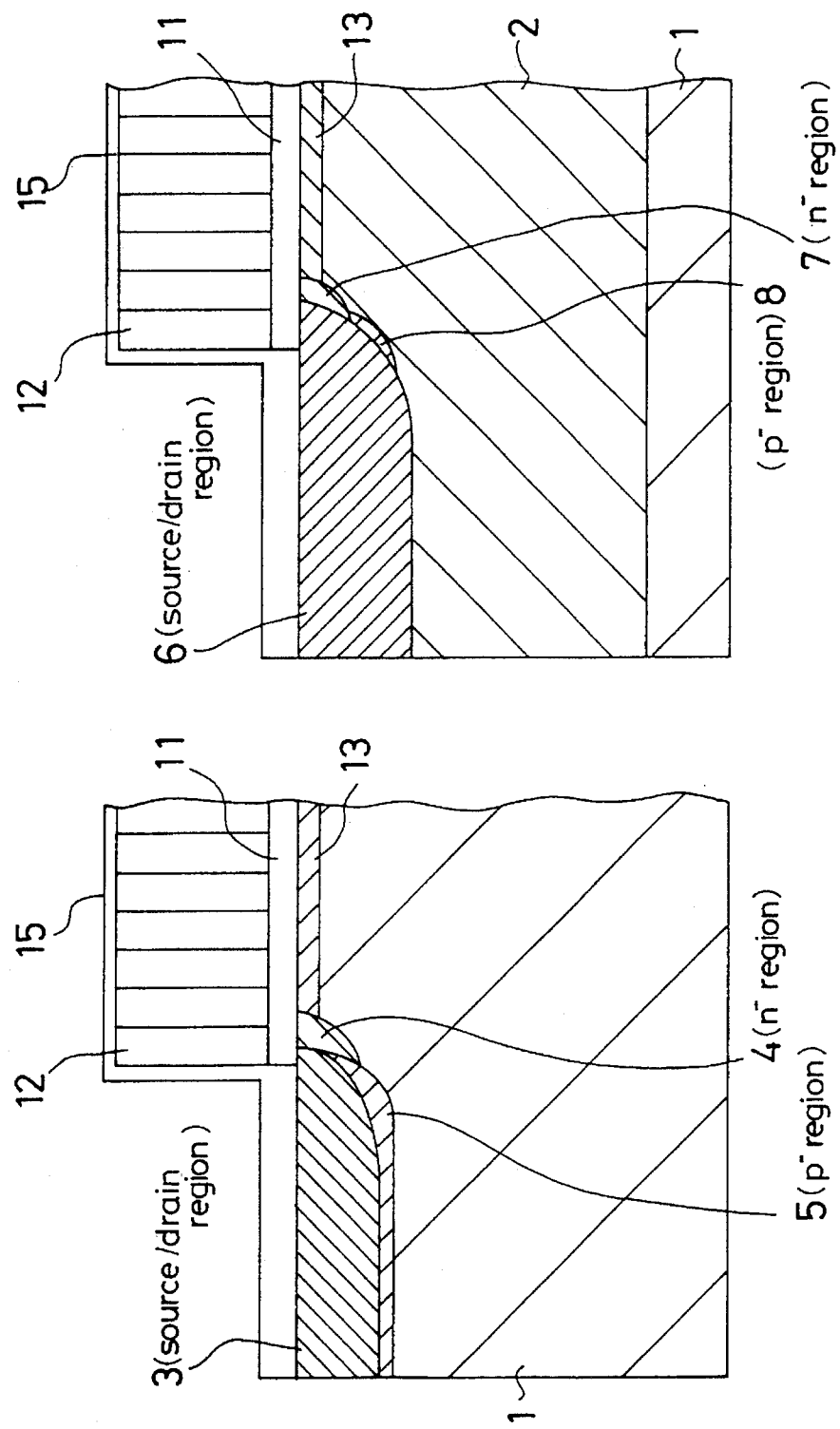

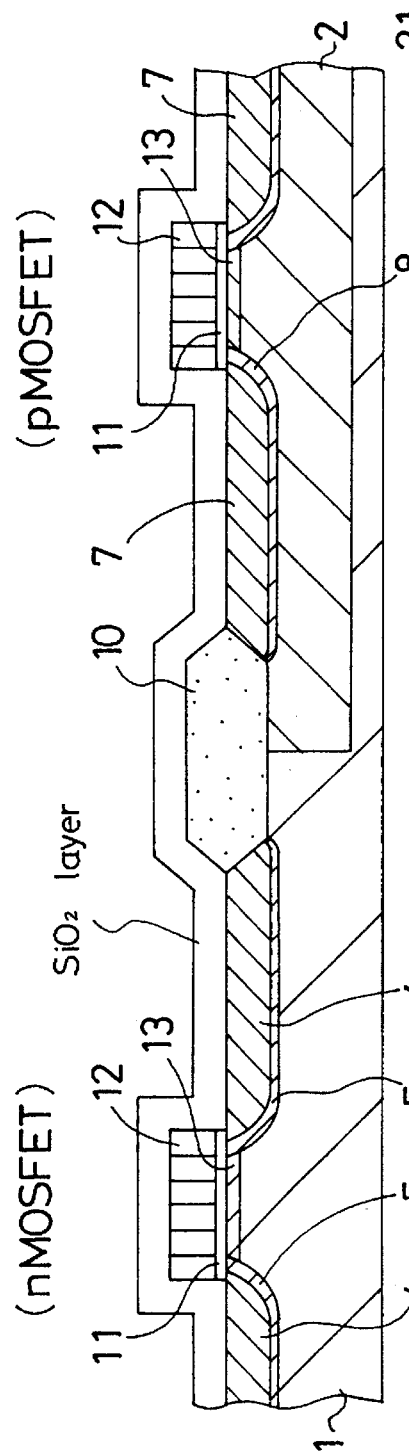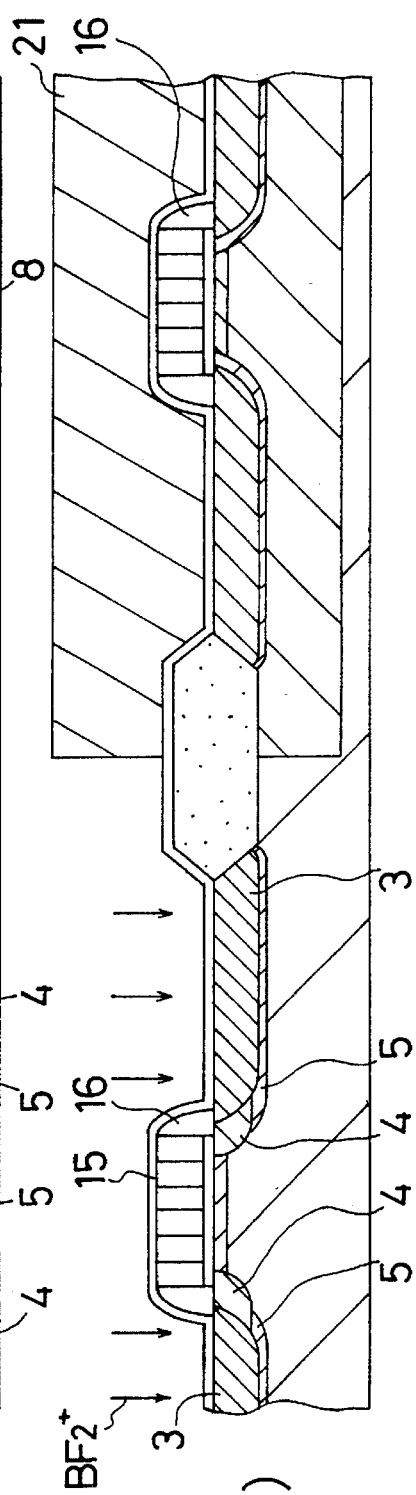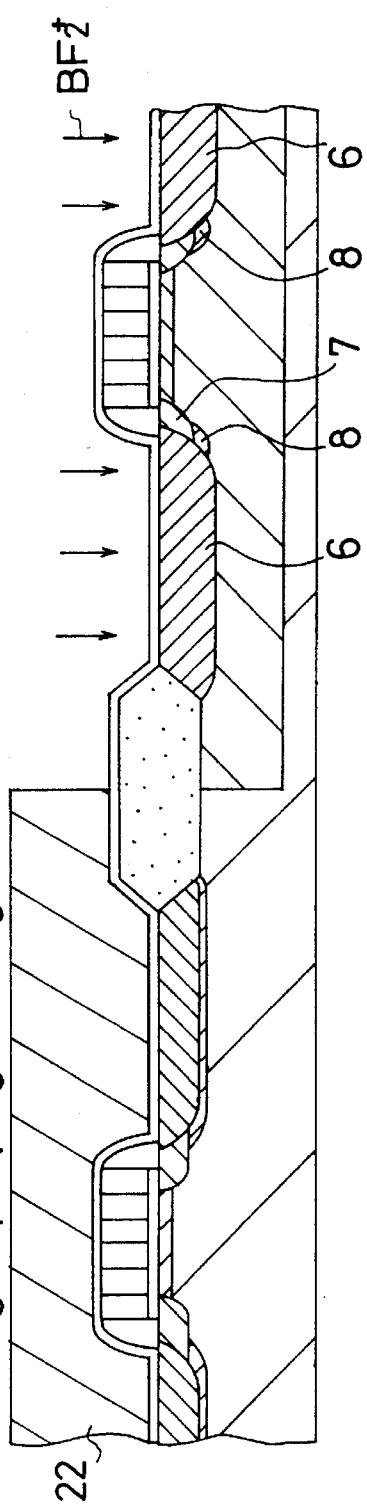

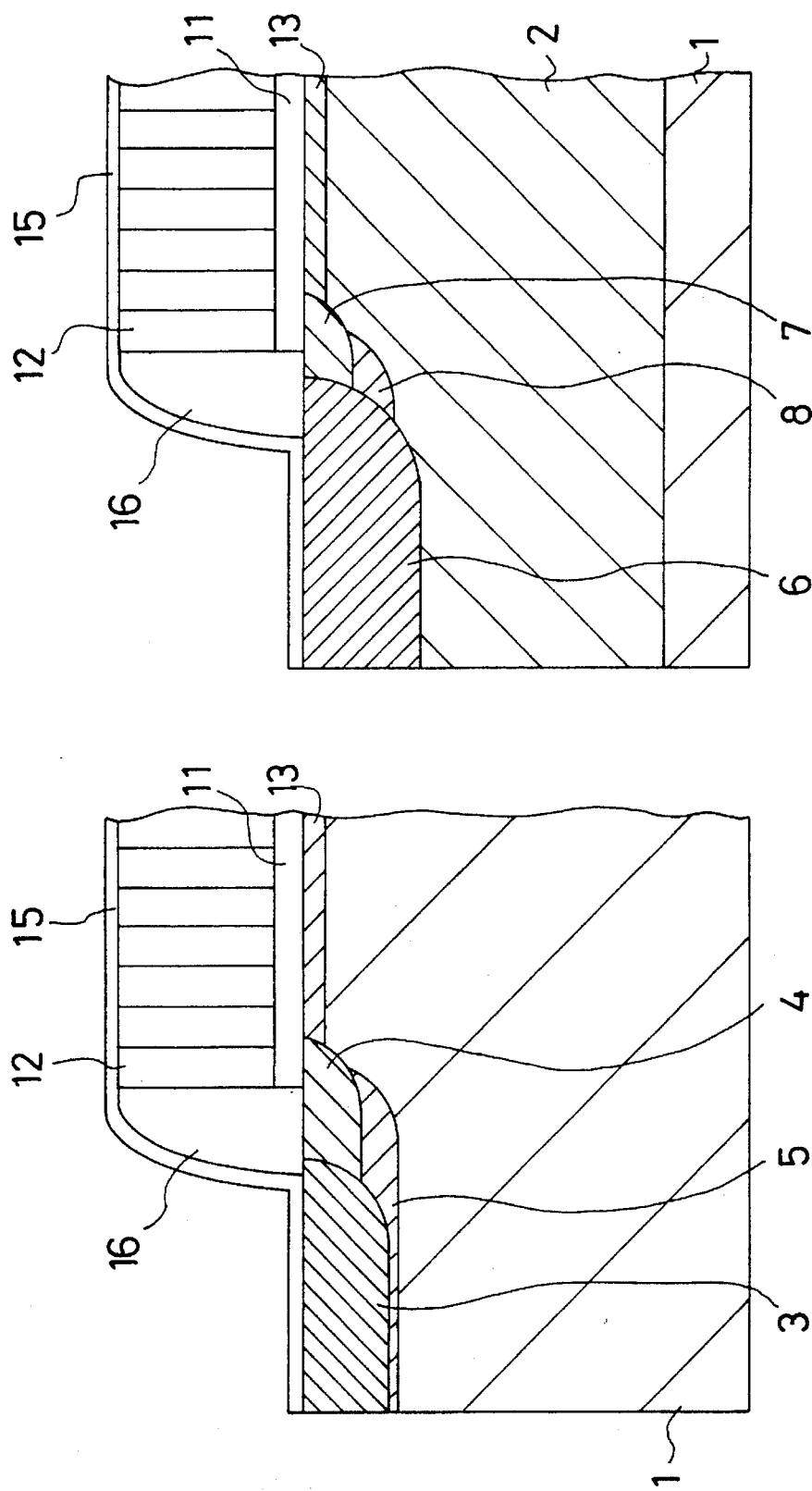

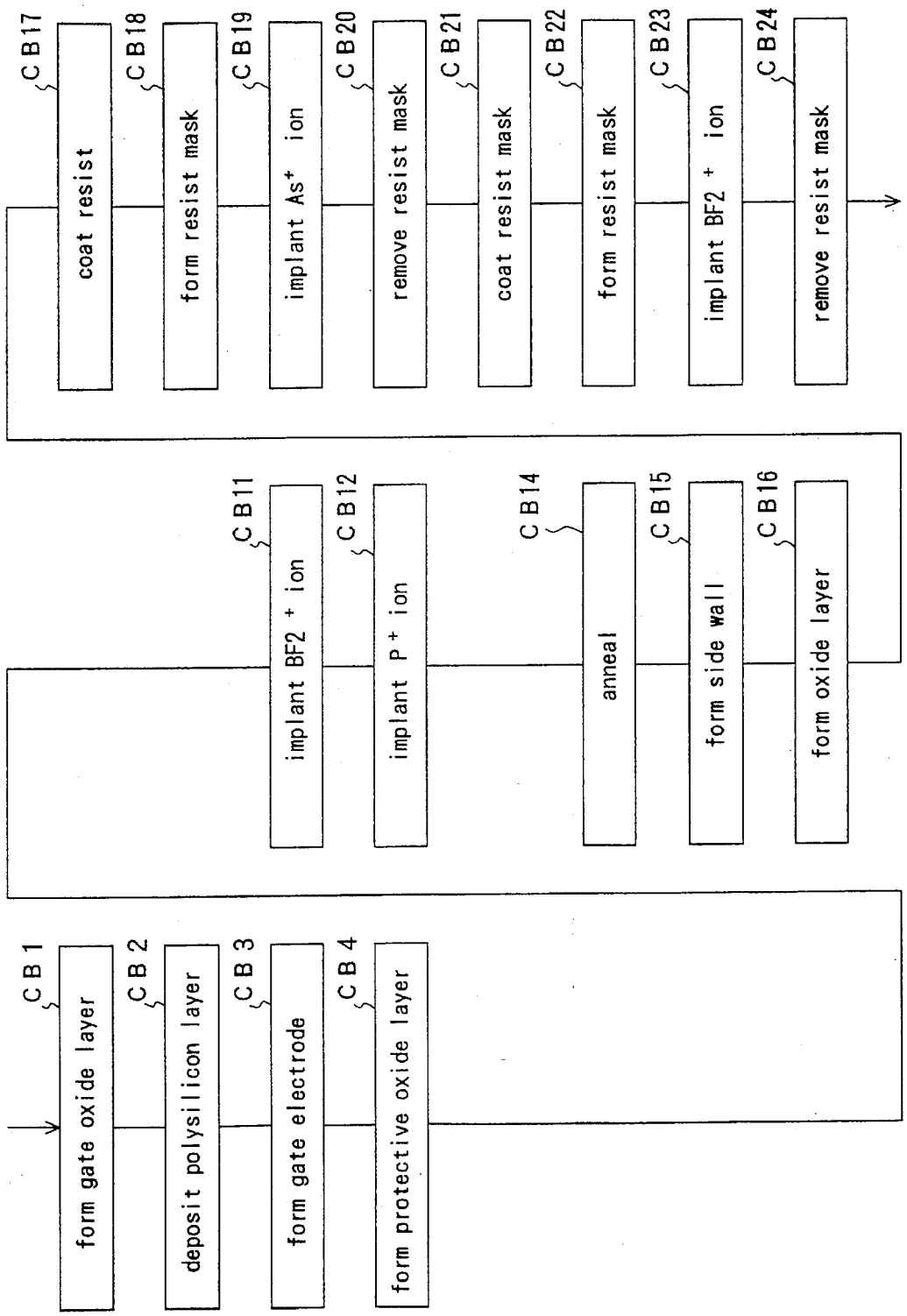

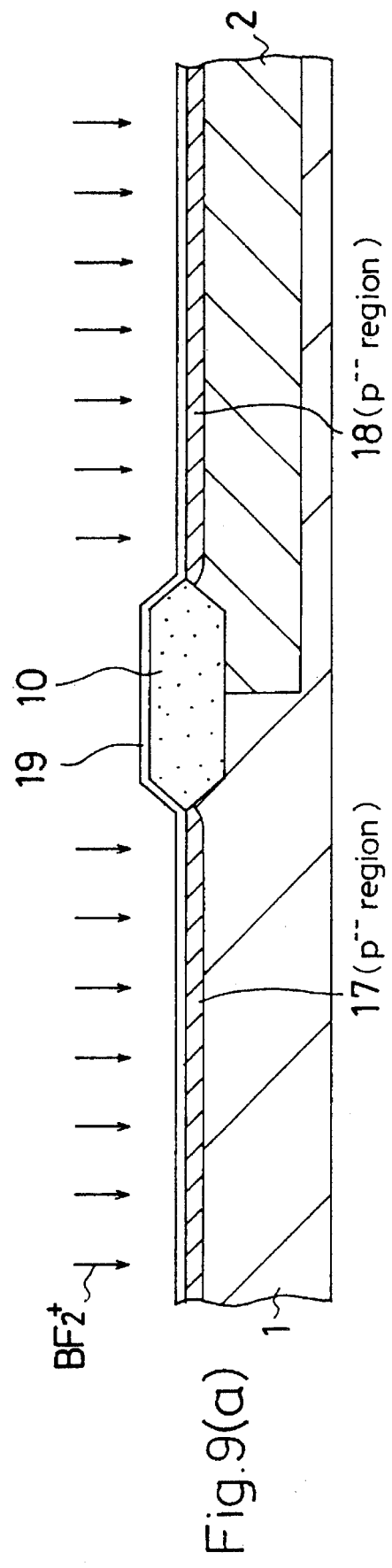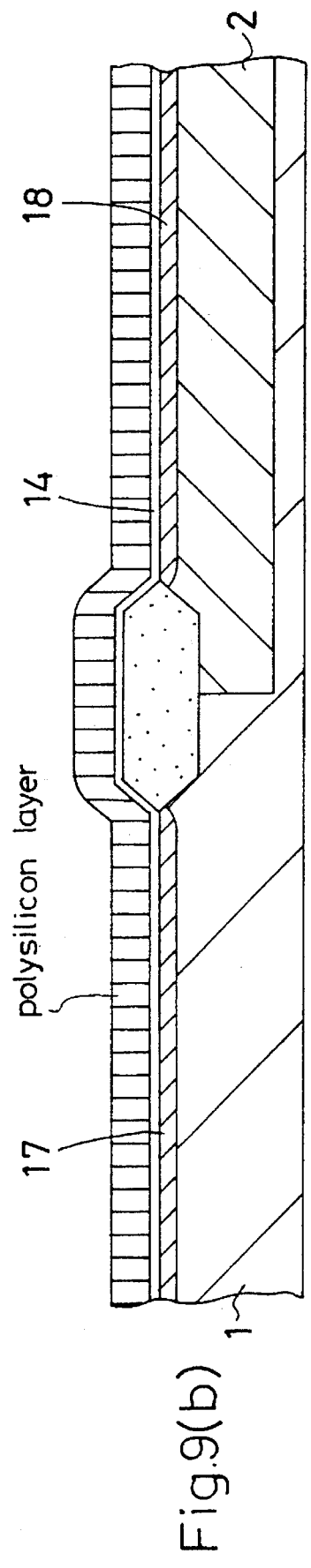

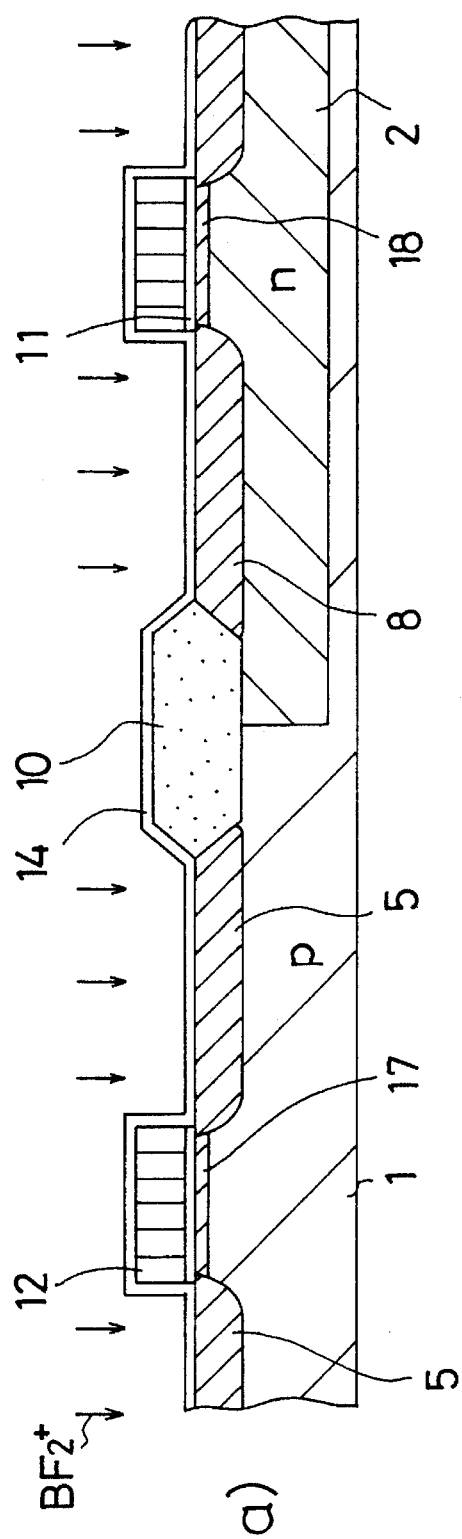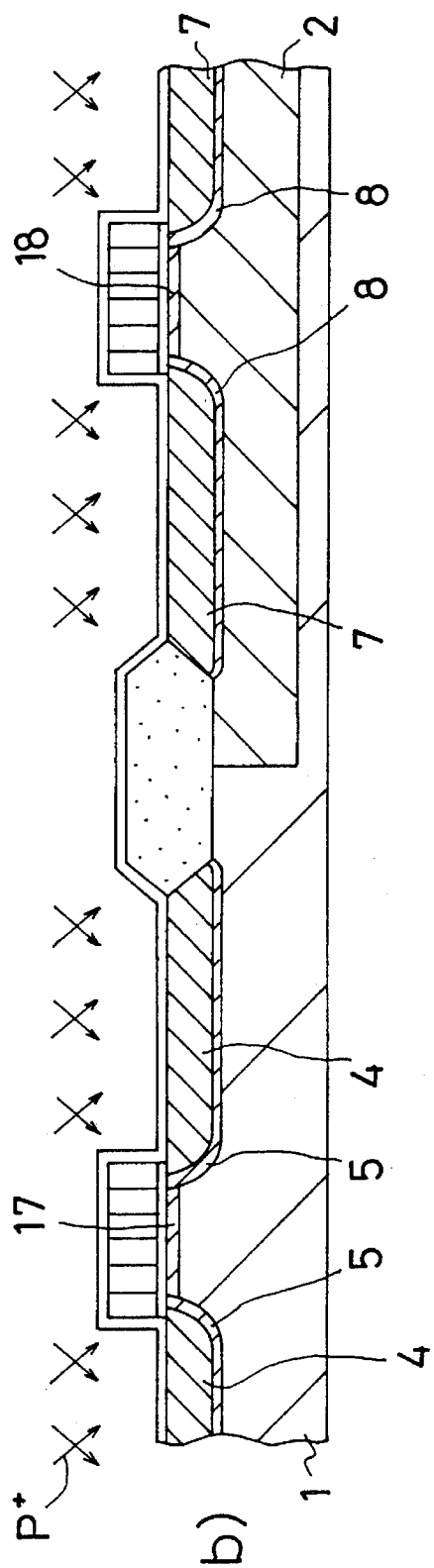
Fig.10(a)
Fig.10(b)

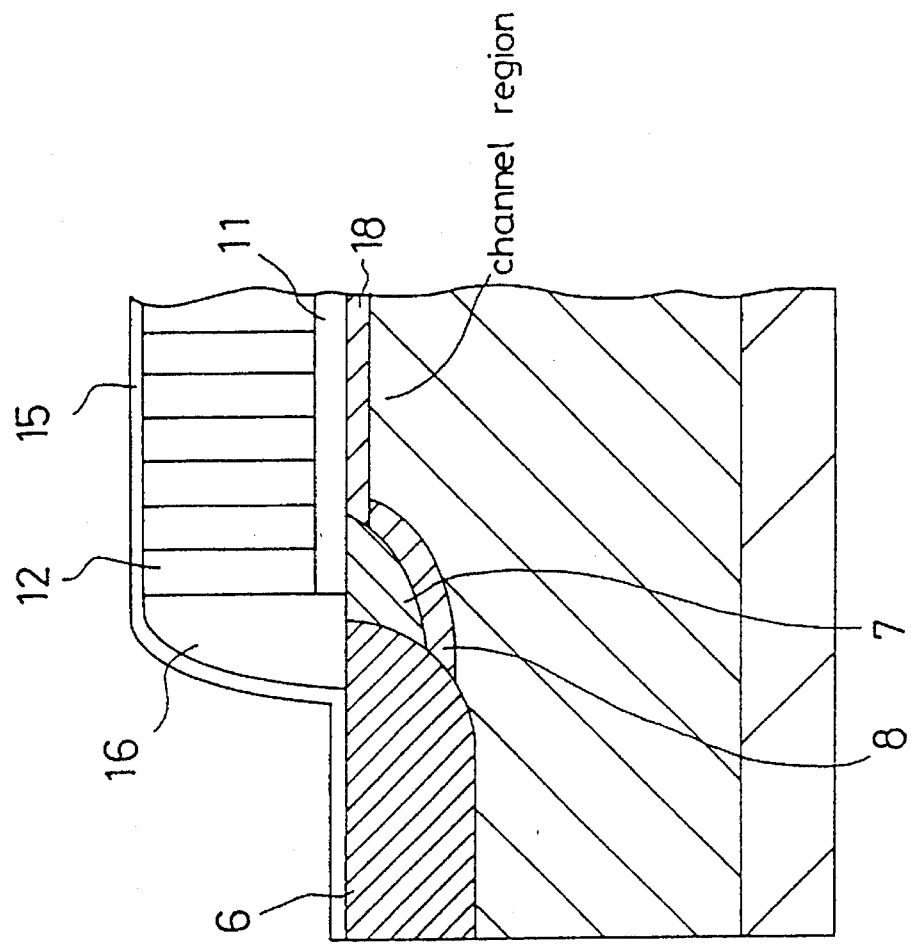
Fig.11(a) (nMOSFET)
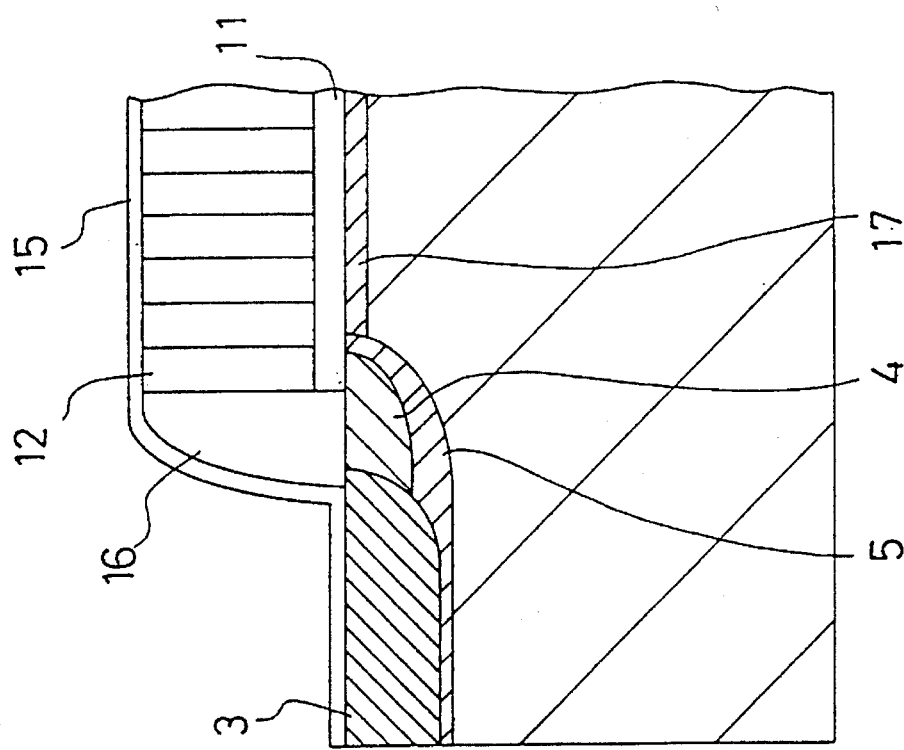
Fig.11(b) (pMOSFET)

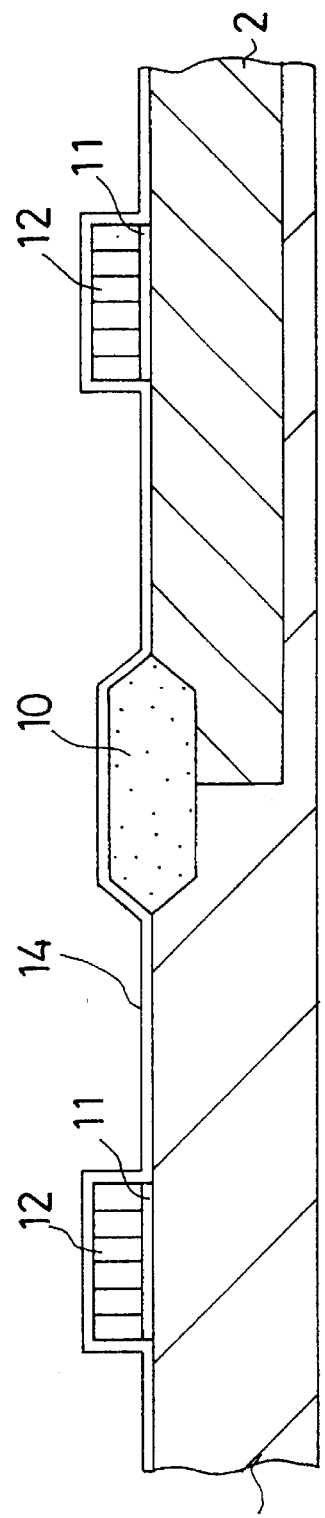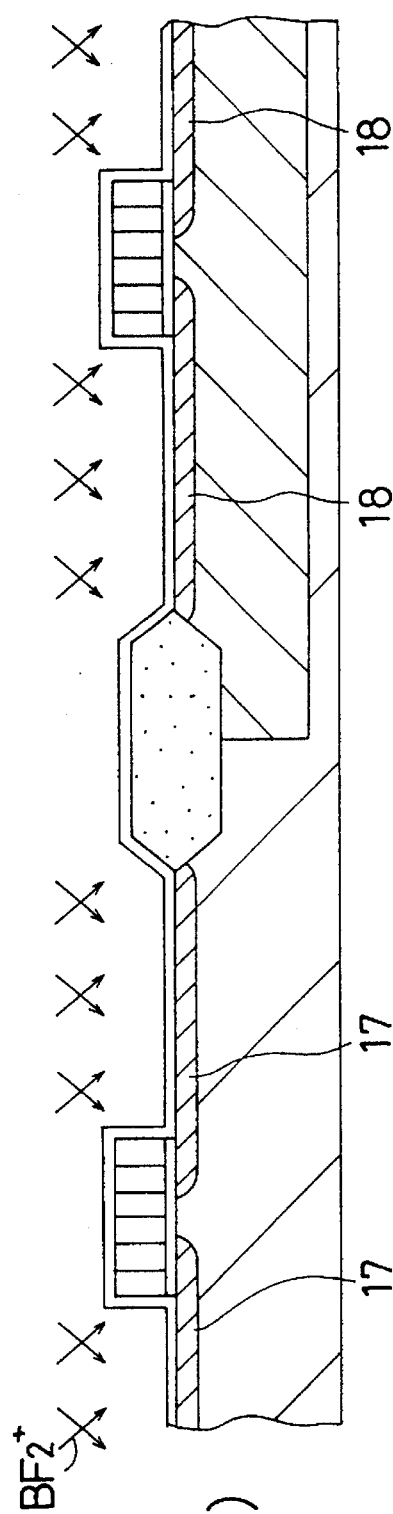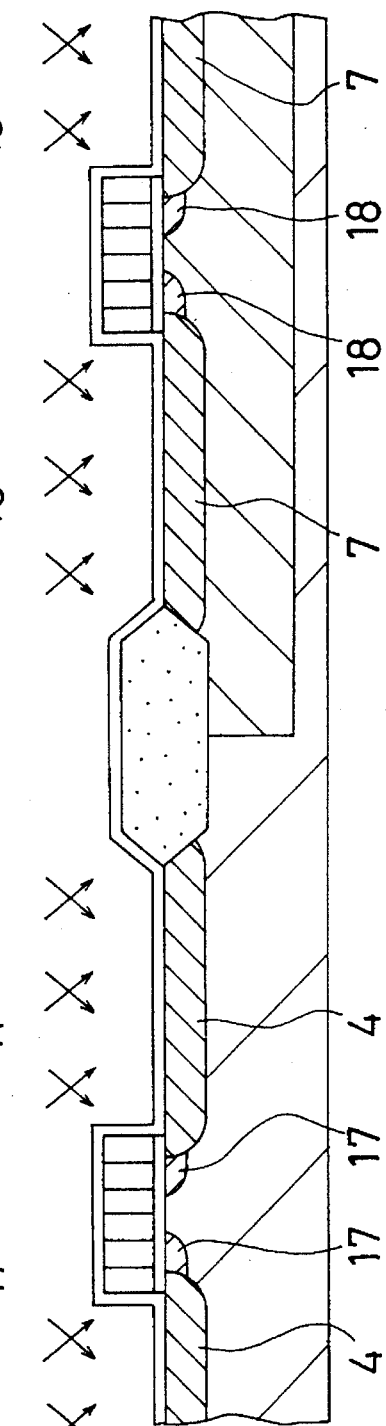

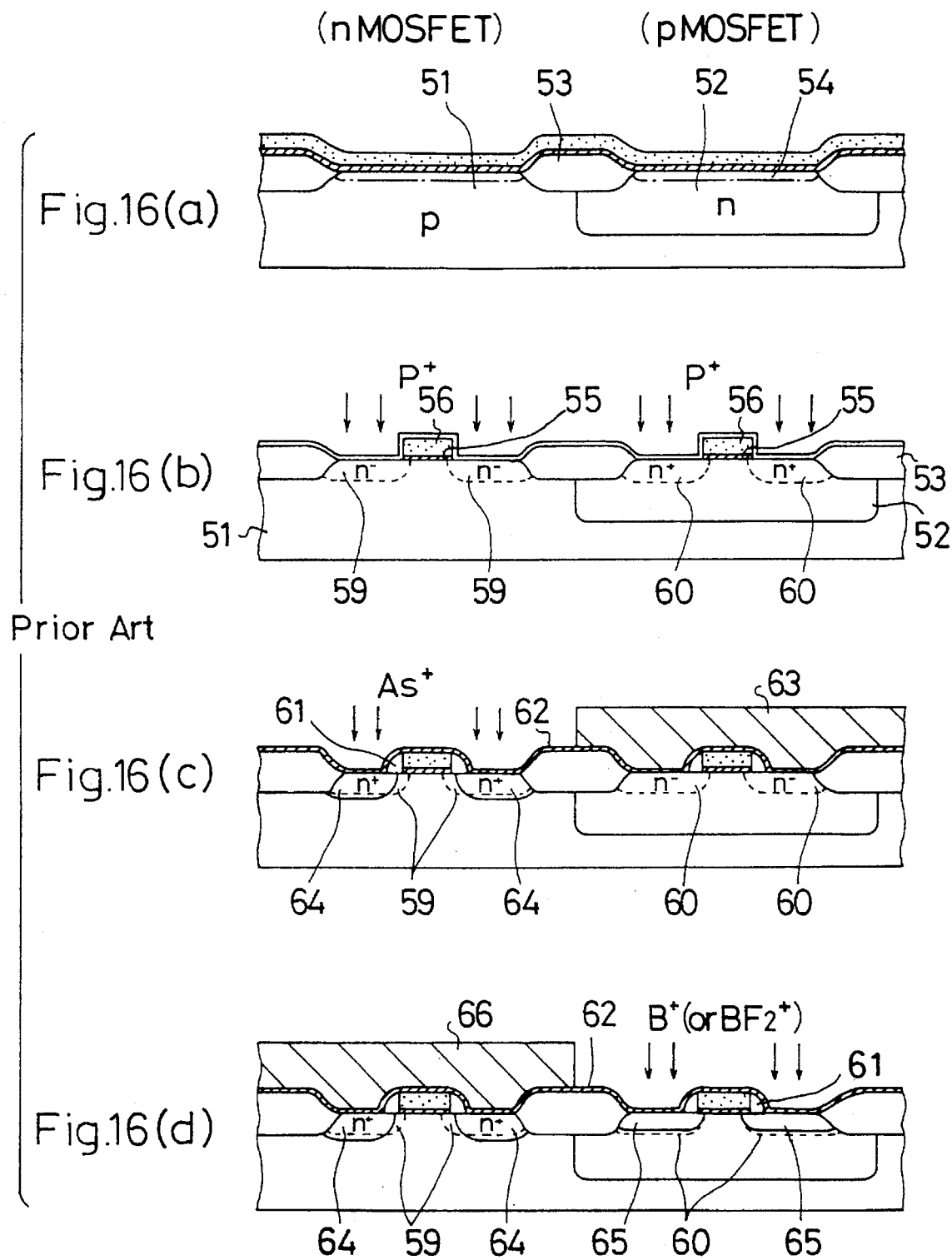

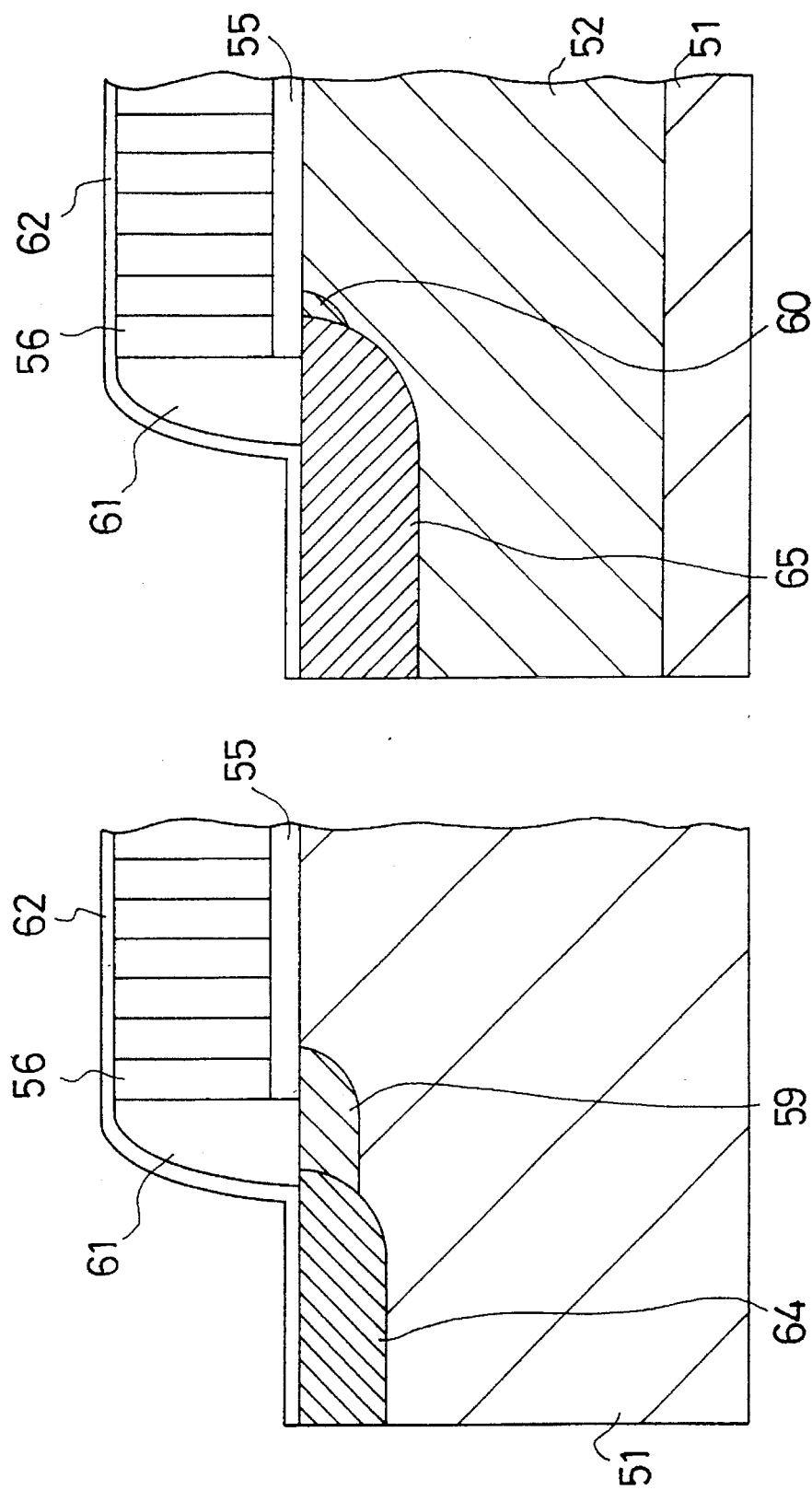

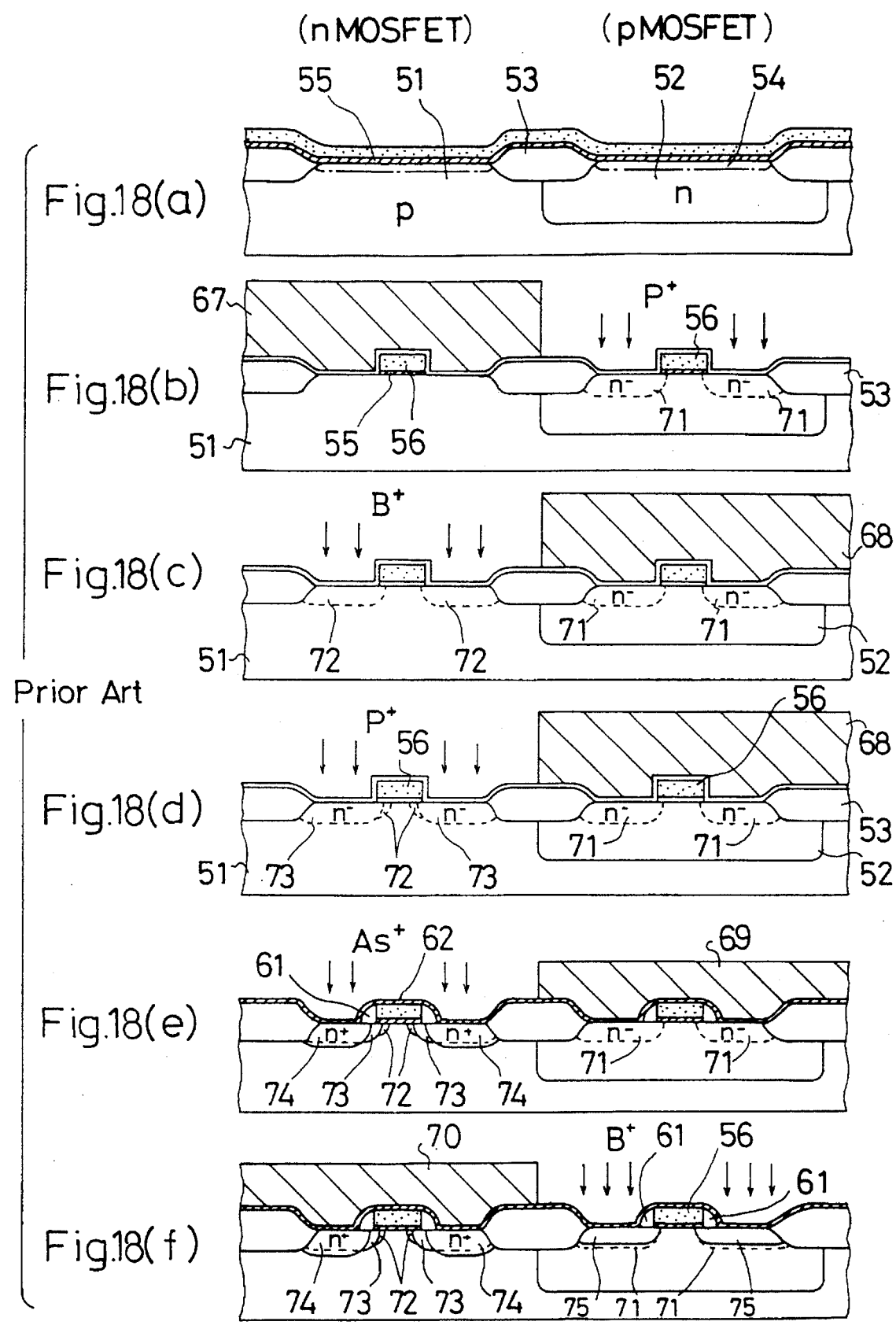

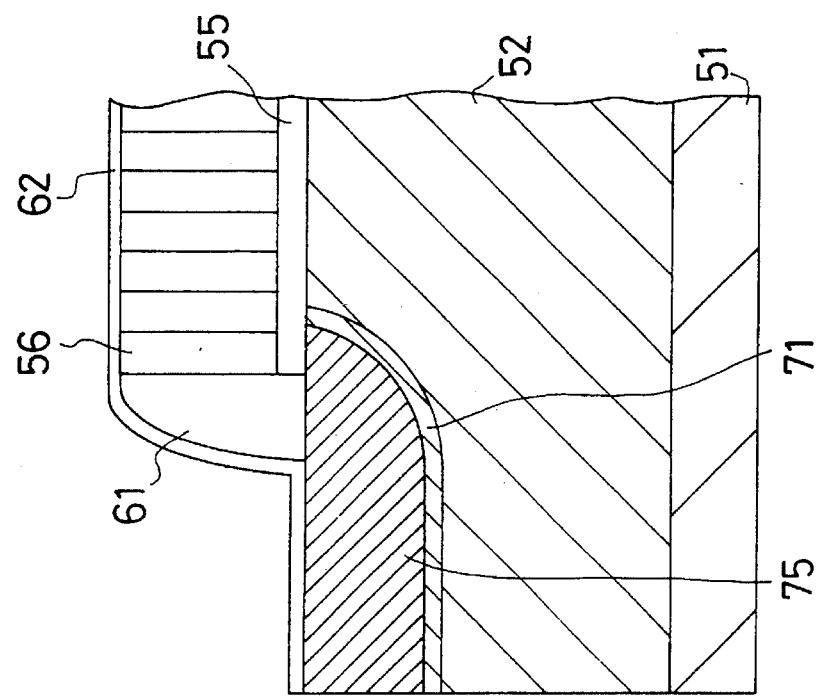
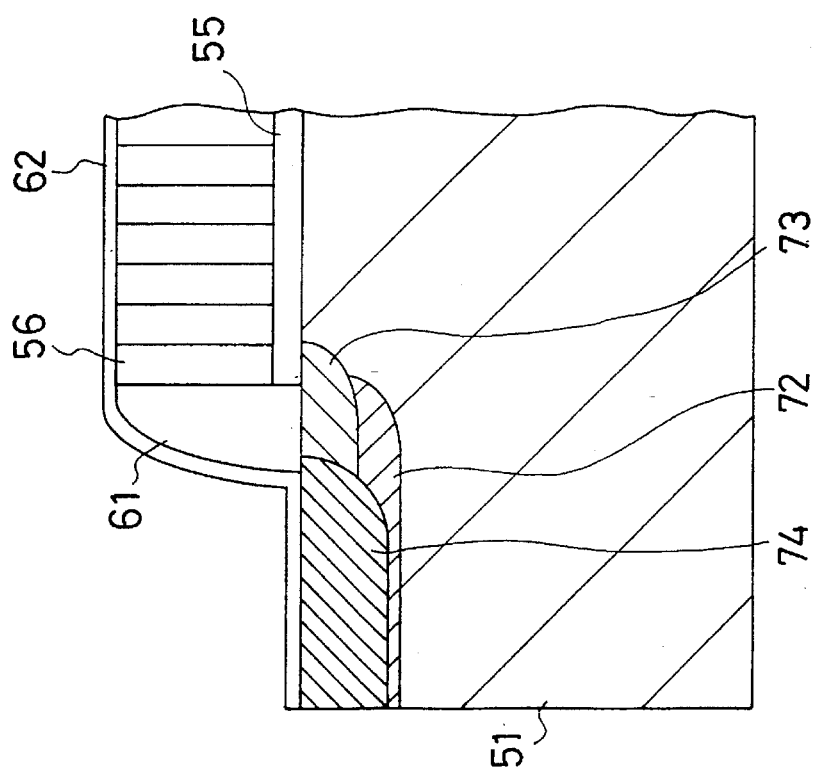

5,500,379

1

METHOD OF MANUFACTURING SEMICONDUCTOR DEVICE

BACKGROUND OF THE INVENTION

This invention relates to a method of manufacturing a semiconductor device having a CMOSFET, and particularly relates to an improvement in a method of forming a local punch through stopper for preventing short channel effect.

In association with microfabrication of a semiconductor device, the gate length of the transistor is shortened, which causes severe short channel effect. In other words, an electrical characteristic of tile transistor is varied accompanied by dimensional fluctuation of the gate of the MOS transistor.

As a method for preventing the short channel effect, there are known techniques. One is to increase the concentration of impurity doped to the substrate. Another is to provide a region, called punch through stopper, which is more heavily doped than the substrate with an impurity of same polarity type as that of the substrate beneath the channel region. In the former method, junction capacitance between the source/drain region and the substrate is large because of the high impurity concentration of the substrate and the mobility of carrier is lowered because of the high impurity concentration of the channel region. As a result, the electric characteristic of the MOS transistor is lowered. In the latter method, the junction capacitance between the source/drain region and the substrate is increased and the carrier mobility is lowered. In the latter method, the short channel effect is more effectively prevented than the former method, so that the method in which the punch through stopper is provided is often applied to a transistor under about 1.0 micron rule. However, in the MOSFETs, with further short gate length, the electric characteristic is further lowered when the punch through stopper is provided therein.

While, in a CMOS transistor, a p-MOSFET and a n-MOSFET are different from each other in drop of threshold voltage even with the same gate length. For example, FIG. 22 shows variations in threshold voltage of p-MOSFET and n-MOSFET with respect to the gate length in the case of a double well structure ("VLSI manufacturing technique" page 43, edited by Tokuyama and Hashimoto, published by Nikkei BP, Co. Ltd. in 1989). In FIG. 22, it is cleared that even with the same gate length, the threshold voltage of the p-MOSFET drops more severely than that of the n-MOSFET. It is understood that the reason is that impurity immerses to the channel region to shorten an effective channel length in the p-MOSFET more than in the n-MOSFET because the diffusibility of p-type impurity, boron (B), is higher than that of n-type impurity, phosphorus (P) or arsenic (As).

As a method for preventing the short channel effect while preventing the increase in junction capacitance between the source/drain region and the substrate, like the punch through stopper, a method in which a region having the same function as the punch through stopper is formed at a local point is applied to a case with about 1 micron gate length. This method is such that after the gate electrode is patterned, the impurity whose polarity type is the same as that of the substrate is doped more heavily than in the substrate, then the impurity for forming the source/drain regions is implanted. Thereby a narrow region (hereinafter referred to as local punch through stopper) to which the impurity of same polarity type as that of the substrate is more heavily doped than in the channel region is formed.

2

Laid Open unexamined Japanese Patent Application No.2-22862 discloses an example that the local punch through stopper is formed at the p-MOSFET only. Hereinafter explained is the method of manufacturing this prior art semiconductor device, with reference to FIG.16($a$)–16($d$) which are sections each showing a state of the semiconductor substrate in the manufacturing method recited in the reference.

First, a n-well 52 is formed in a p-type semiconductor substrate 51, and an isolation 53 is formed at a boundary region thereto and a boundary region to the semiconductor element to separate them. Then, each channel region receives a channel dose 54, and a gate oxide layer 55 is formed entirely. FIG.16($a$) shows the state at this time. Next, a polysilicon layer to be a gate electrode is formed, a n-type impurity is introduced to the polysilicon layer to lower the resistance thereof, then the gate electrode 56 is formed by patterning. Subsequently, low-dose phosphorus ($P^+$) ion implant is conducted entirely to provide $n^-$ regions 59, 59 at regions to be source/drain regions of a n-MOSFET and a p-MOSFET. At the same time, $n^-$ regions 60, 60 to be local punch through stoppers ("$n^-$ pocket region" in the reference) are formed at the p-MOSFET. FIG.16($b$) shows the state at this time.

Next, side walls 61 are formed at both sides of the gate electrodes 56 of the n-MOSFET and p-MOSFET. Then, as shown in FIG. 16($c$), another protective oxide layer 62 is formed, a resist mask 63 is provided over the p-MOSFET, and high-dose arsenic ($As^+$) ion implant is conducted to the active region of the n-MOSFET to form source/drain regions 64, 64 of the n-MOSFET. As well, a resist mask 66 is provided over the n-MOSFET, high-dose boron ($B^+$) ion implant is conducted to provide source/drain regions 65, 65 of the p-MOSFET. FIG. 17($a$), 17($b$) are respectively sections showing the end parts of the gate electrodes of the n-MOSFET and p-MOSFET which are formed according to the manufacturing method in the reference.

According to the above steps, the $n^-$ regions 59, 59 lightly doped with the n-type impurity serve as LDDs (lightly doped drain) in the n-MOSFET. In other words, the $n^-$ regions 59, 59 restrain the generation of hot carrier in the n-MOSFET where the hot carrier is likely to occur. On the other hand, the $n^-$ regions 60, 60 serve as the local punch through stoppers in the p-MOSFET. Namely, in the p-MOSFET which has the severer short channel effect, the $n^-$ regions 60, 60 restrain the short channel effect.

In the case with the local punch through stoppers, the carrier mobility is not lowered because of no necessity of increasing of impurity concentration of the channel region. Also, the shallow local punch through stopper is formed, which enables to restrain the increase in junction capacitance of the source/drain region to tile substrate. In other words, in the prior art technique in the reference, the impurity for forming local punch through stopper is implanted to the p-MOSFET concurrently with the implantation of impurity for forming LDD of the n-MOSFET, thereby the short channel effect in the p-MOSFET is prevented and durability to hot carrier in the n-MOSFET is improved, while facilitating the manufacturing steps.

However, in the transistor with less than 1 micron gate, the short channel effect is not completely prevented by the above prior art technique. Especially, it is enabled to diffuse the impurity implanted at comparatively low temperature, which causes small difference in diffusibility between boron and phosphorus (or arsenic) at low-temperature diffusion. As a result, for higher integration, the local punch through stopper is required to form not only at the p-MOSFET but also at the n-MOSFET. However, in the above reference, the local punch through stopper cannot be provided at the n-MOSFET. Therefore, the short channel effect could not be effectively prevented in the CMOSFET with less than 1.0 micron gate.

Moreover, since the inclination of distribution of impurity concentration in the source/drain regions of the p-MOSFET becomes sever in association with the lowering of the diffusion temperature of $B^+$ ion, the durability to hot carrier is lowered also in the p-MOSFET. Therefore, in the manufacturing method in the above reference, in spite of the side walls provided, the durability to hot carrier in the p-MOSFET may be lowered without the LDD in the p-MOSFET.

In order to completely prevent the short channel effect in the CMOSFET having further micro gate, the punch through stoppers are required to be formed at both n-MOSFET and p-MOSFET. Therefore, in general, the local punch through shoppers are formed at both n-MOSFET and p-MOSFET according to the steps shown in FIGS. 18(a)–18(f) and 21. Hereinafter discussed is a method of manufacturing a semiconductor device having the conventional local punch through stoppers, with reference to the sections of FIG. 18(a)–18(f) and the flow chart of FIG. 21.

First, after the n-well 52 at the p-type semiconductor substrate 51 and the isolation 53 are formed, steps CX1 and CX2 in FIG. 21 are conducted to form the gate oxide layer 55 and the polysilicon layer, whereby the semiconductor substrate shown in FIG. 18(a) is obtained. The steps insofar are the same as that in the above reference (refer to FIG. 16 (a)). Next, as shown in FIG. 18(b), after introducing the n-type impurity into the polysilicon layer, step CX3 is conducted to form the gate electrode 56 by patterning the polysilicon layer. After a protective oxide layer is formed by conducting a protective oxidation step of CX4, the resist mask 67 is formed, a part of p-MOSFET is opened, low-dose phosphorus ($P^+$) ion implant is conducted to form the $n^-$ regions 71, 71 to be the local punch through stoppers at the p-MOSFET and the resist mask 67 is removed in steps CX5–CX8.

Next, as shown in FIG. 18(c), in steps CX9 to CX11, the resist mask 68 is provided over the p-MOSFET, the upper part of the n-MOSFET is opened, and low-dose $B^+$ or $BF2^+$ ion implant is conducted to form $p^-$ regions 72, 72 to be the local punch through stoppers at the n-MOSFET. Thereafter, as shown in FIG. 18(d), at steps CX12 and CX13, low-dose $P^+$ ion implant is conducted to form $n^-$ regions 73, 73 to be LDDs of the n-MOSFET and the resist mask 68 is removed.

Subsequently, annealing is conducted at step CX14, and the side walls 61, the protective oxide layer 62 and the resist mask 69 are formed in steps CX15–CX18. At step CX19, high-dose $As^+$ ion implant is conducted to the n-MOSFET to form the source/drain regions 74, 74 (refer to FIG. 18(e)). Then, the resist mask 69 is removed at step CX20. The resist mask 70 open to only the p-MOSFET is formed and high-dose $As^+$ ion implant is conducted to form the source/drain regions 75, 75 of the p-MOSFET in steps CX21 and CX22 (refer to FIG. 18(f)). Finally, the resist mask 70 is removed at step CX24.

FIGS. 19(a), 19(b) show respective sectional constructions of the end parts of the gate electrodes of the respective MOSFETs formed according to the above method. As understood from FIGS. 19(a), 19(b), in addition to the source/drain region 74 heavily doped with the impurity and the LDD 73 lightly doped with the impurity, the local punch through stopper 72 doped with the impurity of opposite polarity type thereto is formed in the n-MOSFET. Also, the source/drain region 75 heavily doped with the impurity and the local punch through stopper 71 lightly doped with the impurity of opposite polarity type thereto are formed in the p-MOSFET. Accordingly, compared with the structure formed according to the prior art method in the reference (see FIG. 17), the short channel effect in the n-MOSFET is prevented and the generation of hot carrier is also lowered. In a case where the LDD is formed at the p-MOSFET, low-dose $B^+$ ion implant is conducted after the step CX7.

Moreover, FIG. 20 shows the steps up to the formation of the gate oxide layer. In detail, after formation of the well and the isolation, the protective oxide layer is formed at CY1, the resist is coated and the resist mask open to only the upper part of the n-MOSFET is formed in steps CY2, CY3. Then, the $BF2^+$ ion which is an impurity for controlling threshold value in the n-MOSFET is implanted at step CY4, and the resist mask is removed at CY5. As well, the coating of resist, the formation of resist mask, the implantation of $P^+$ ion for controlling threshold value and the removal of resist mask are conducted in steps CY6–CY10 for the p-MOSFET. Then, at step CY11, the protective oxide layer is removed. Thereafter, another gate oxide layer is formed at the above step CX1, and the step CX2 and the following steps thereafter are conducted.

However, in the above conventional method shown in FIGS. 18(a)–18(f) and FIG. 21, the formation of resist mask is required four times, which increases the manufacturing cost and the defect occurring rate. It is considered to omit some steps of the method by using the technique in the above reference. For example, at the step CX7, the low-dose $P^+$ ion implant is conducted also to the n-MOSFET without using the resist mask 67 to thus form the LDD of the n-MOSFET. As a result, one step of forming the resist mask can be omitted. However, there still remains three resist mask forming steps, which means increased resist mask forming steps, compared with the manufacturing method of the CMOSFET without the local punch through stopper.

SUMMARY OF THE INVENTION

The first object of the present invention is to provide a method of forming local punch through stoppers at each of n-MOSFET and p-MOSFET, while reducing the number of manufacturing steps.

The second object of the present invention is to reduce the number of steps which are required for forming the local punch through stoppers and LDDs at each of the n-MOSFET and the p-MOSFET.

The third object of the present invention is to form a surface channel region on one MOSFET and form a buried channel region in the other MOSFET, while reducing the number of manufacturing steps.

To attain the first object, in the present invention, impurities of two-polarity types are concurrently, lightly doped to the n-MOSFET and the p-MOSFET.

A method of manufacturing a CMOS transistor with a n-MOSFET and a p-MOSFET on a semiconductor substrate, comprises the steps of:

introducing an impurity for controlling threshold value into at least a part to be a channel region of the n-MOSFET of the semiconductor substrate;

introducing an impurity for controlling threshold value into at least a part to be a channel region of the p-MOSFET of the semiconductor substrate;

forming a gate electrode of the n-MOSFET and a gate electrode of the p-MOSFET on the semiconductor substrate;

conducting low-dose ion implant of a p-type impurity to both of the n-MOSFET and the p-MOSFET, using the gate electrodes of the n-MOSFET and the p-MOSFET as masks;

conducting low-dose ion implant of a n-type impurity to both of the n-MOSFET and the p-MOSFET, using the gate electrodes of the n-MOSFET and the p-MOSFET as masks;

forming source/drain regions at the n-MOSFET by heavily introducing a n-type impurity after the steps of low-dose ion implant of the p-type and n-type impurities; and forming source/drain regions at the p-MOSFET by heavily introducing a p-type impurity after the steps of low-dose ion implant of the p-type and n-type impurities, wherein $p^-$ regions to be local punch through stoppers are formed between the source/drain regions and the channel region of the n-MOSFET, and $n^-$ regions to be local punch through stoppers are formed between the source/drain regions and the channel regions of the p-MOSFET.

Accordingly, the CMOS semiconductor device with less short channel effect is manufactured, since the local punch through stoppers are formed at each MOSFET. The concurrent ion implantation of the impurity to each MOSFET forms the punch through stoppers at each MOSFET, thus the formation of the resist mask for covering each MOSFET is unnecessary. This means that the formation of two resist masks and the removal thereof are unnecessary, reducing the number of manufacturing steps.

To attain the second object, in addition to the above steps, the step of forming side walls at both sides of each gate electrode after the low-dose ion implant of the p-type and n-type impurities and before the formation of the source/drain regions of each MOSFET is further provided, wherein $n^-$ regions to be LDDs are formed between the source/drain regions and the channel region of the n-MOSFET, and $p^-$ regions to be LDDs are formed between the source/drain regions and the channel region of the p-MOSFET.

Accordingly, the CMOS semiconductor device has less short channel effect and high durability to hot carrier. Since the concurrent ion implantation of the impurity to each MOSFET forms the punch through stopper at each MOSFET, the formation of the resist mask and removal thereof are unnecessary, reducing the number of manufacturing steps.

In the above two methods, in the steps of low-dose ion implant of p-type impurity and of low-dose ion implant of n-type impurity, respective ion doses of the p-type impurity and the n-type impurity are adjusted so that respective lowerings of the threshold voltages of the n-MOSFET and the p-MOSFET, which are accompanied by each impurity introduction, are almost equal to each other.

By introducing the two kinds of low-dose impurities into a region between the channel region and the source/drain regions in each MOSFET, the threshold voltage is lowered. However, the adjustment of the low-dose impurities equalizes the lowerings of the threshold voltage in the MOSFETs to each other, thus optimum control of the channel effect is attained.

To attain the third object, the above method comprises the step of forming a well at a region where one of the n-MOSFET or the p-MOSFET is to be formed, while introducing an impurity for controlling threshold value thereinto, wherein at the step of introducing the impurity for controlling threshold value into the other MOSFET, ion implantation of an impurity is conducted to the surface of active regions of both of the n-MOSFET and the p-MOSFET before the formation of the gate electrodes of both MOSFETs, and in the MOSFET, a buried channel region is formed in the well.

Accordingly, the surface channel region is formed at one MOSFET and the buried channel region is formed at the other MOSFET. Hence, the impurities to be introduced to the gate electrode of each MOSFET have the same polarity, which reduces the number of manufacturing steps. At this time, the resist mask for ion implant of the impurity for controlling threshold value into each MOSFET is unnecessary, which means further reduction of the manufacturing steps.

The low-dose ion implant of the p-type impurity may be conducted according to at least two-step large tilt angle ion implant method so that the step of introducing the impurity for controlling threshold value into the other MOSFET is omitted.

In this case, the buried channel region can be formed in the well at one MOSFET which is formed in the well. In this case, the additional step of introducing the impurity for controlling threshold value of the other MOSFET is unnecessary, which means further reduction of the manufacturing steps.

BRIEF DESCRIPTION OF THE DRAWINGS

FIGS. 1(a), 1(b) are sections respectively showing states of a semiconductor substrate at steps of successively implanting impurities in a manufacturing method of a CMOS device according to a first embodiment.

FIGS. 3(a), 3(b) are sections respectively showing the end parts of the gate electrodes of n-MOSFET and p-MOSFET which are finally obtained according to the first embodiment.

FIGS. 5(a)–5(c) are sections respectively showing states of the semiconductor substrate at steps of forming side walls and of forming source/drain regions of each MOSFET in a manufacturing method in a second embodiment.

FIGS. 6(a), 6(b) are sections respectively showing the end parts of the gate electrodes of n-MOSFET and p-MOSFET which are finally obtained according to the second embodiment.

FIG. 7 is a flow chart showing the manufacturing method of the second embodiment.

FIGS. 9(a), 9(b) are sections respectively showing state of the semiconductor substrate at steps before the formation of the gate electrode in a manufacturing method of a CMOS device according to a third embodiment.

FIGS. 10(a), 10(b) are sections respectively showing states of the semiconductor substrate at steps of successively implanting the impurities into each MOSFET in the manufacturing method of the CMOS device according to the third embodiment.

FIGS. 11(a), 11(b) are sections respectively showing the end parts of the gate electrodes of n-MOSFET and p-MOSFET which are finally obtained according to the third embodiment.

FIGS. 13(a)–13(c) are sections respectively showing states of the semiconductor substrate at steps of successively implanting the impurities into each MOSFET in a manufacturing method of a CMOS device according to a fourth embodiment.

FIGS. 16(a)–16(d) are sections respectively showing states of a semiconductor substrate in the manufacturing method of a CMOS device according to the prior art reference.

FIGS. 17(a), 17(b) are sections respectively showing the end parts of the gate electrodes of n-MOSFET and p-MOSFET which are finally, imaginably obtained according to the prior art reference.

FIGS. 18(a)–18(f) are sections respectively showing states of the semiconductor substrate in the conventional manufacturing method of a CMOS device with a local punch through stopper at each MOSFET.

FIGS. 19(a), 19(b) are sections respectively showing the end parts of the gate electrodes of the conventional n-MOSFET and p-MOSFET each of which has the local punch through stoppers and is finally obtained.

DETAILED DESCRIPTION OF THE INVENTION (FIRST EMBODIMENT)

Figure 2A:
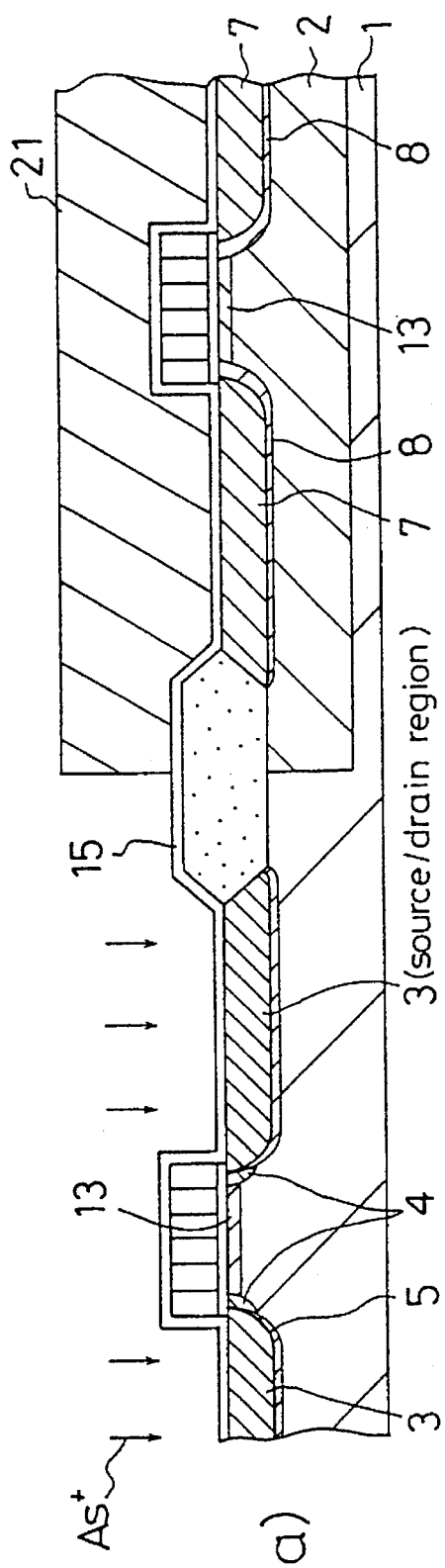
FIGS. 2(a), 2(b) are sections respectively showing states of the semiconductor substrate at steps of forming each source/drain region of respective MOSFETs in the manufacturing method of the CMOS device according to the first embodiment.
Figure 2B:
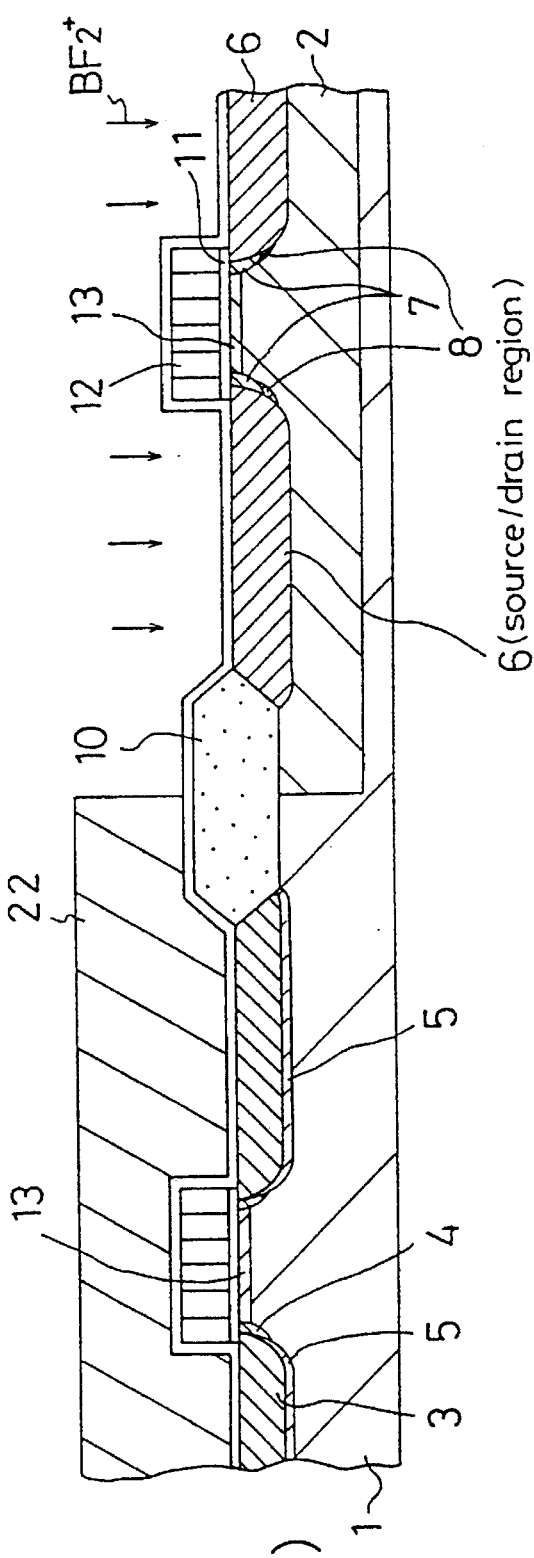
Figure 4:
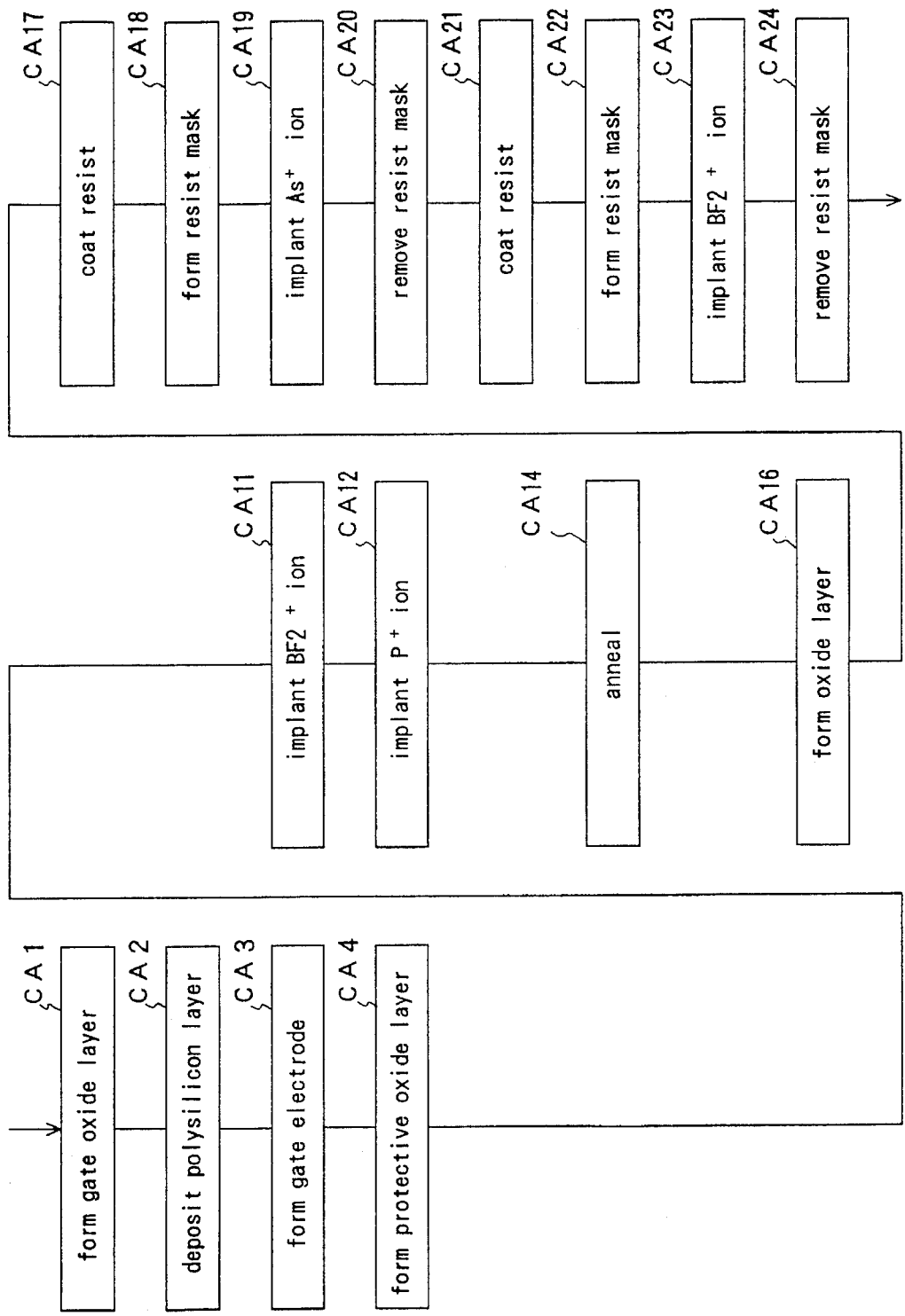
FIG. 4 is a flow chart showing the manufacturing method in the first embodiment.

Description is made below of a method of manufacturing a semiconductor device according to the first embodiment of the present invention, with reference to the accompanying drawings. FIGS. 1(a), 1(b) and FIGS. 2(a), 2(b) are sections each showing a state of a semiconductor substrate at respective manufacturing steps of the semiconductor device in the first embodiment. FIG. 4 is a flow chart showing the manufacturing steps CA1–CA24 of the semiconductor device in the first embodiment.

Figure 21:
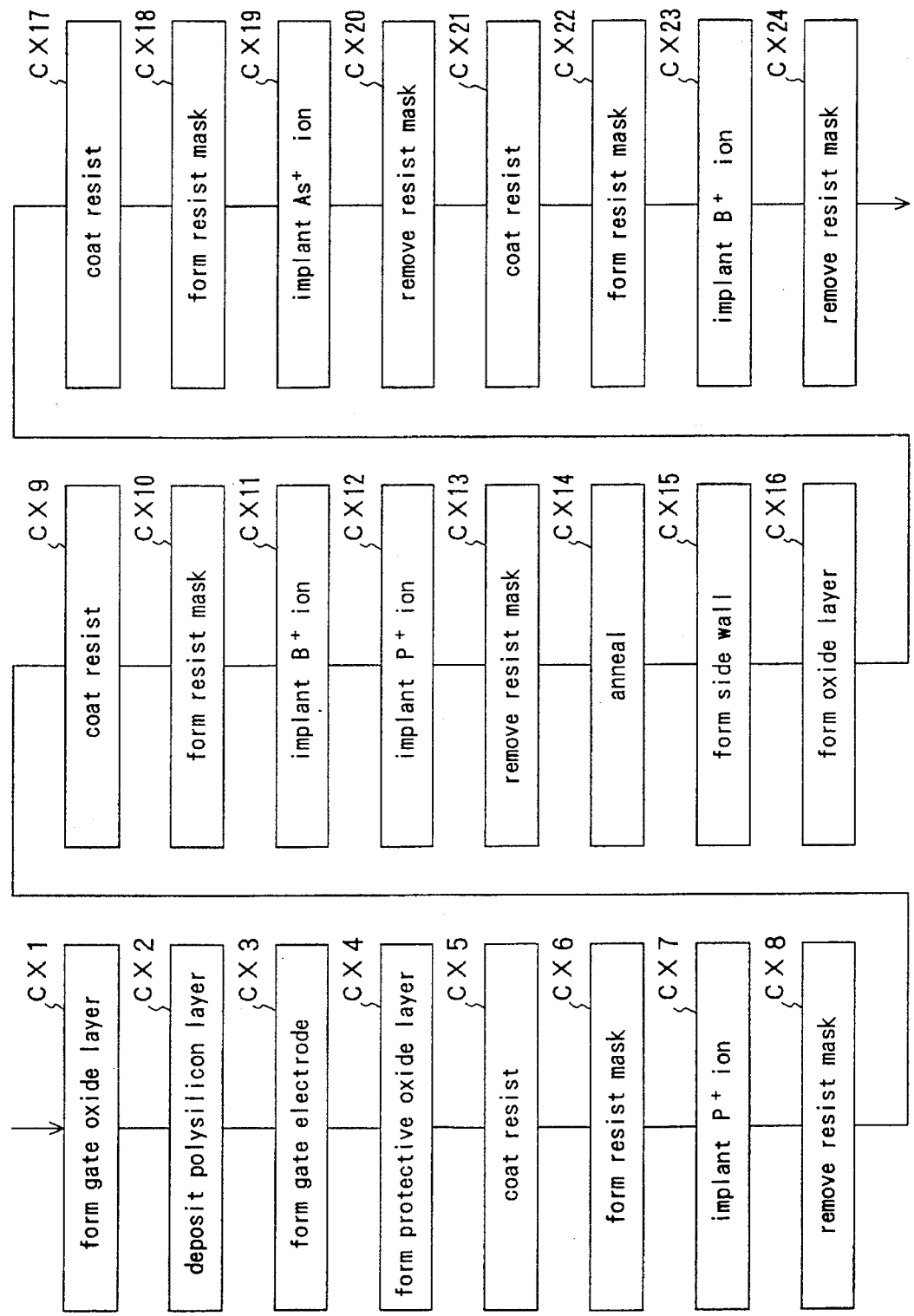
FIG. 21 is a flow chart showing steps after the formation of the gate electrode in the conventional manufacturing method of a CMOS device with the local punch through stoppers at each MOSFET.
Figure 22:
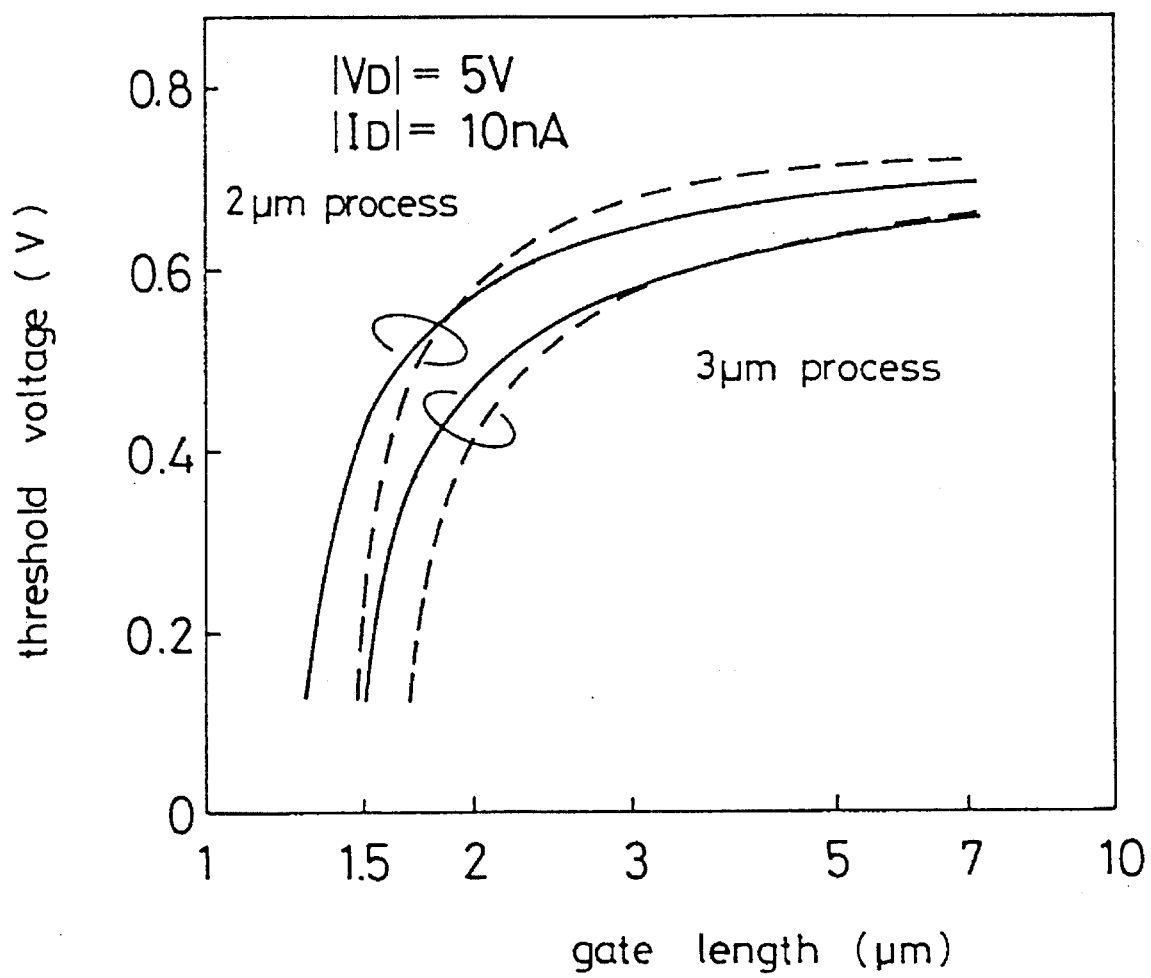
FIG. 22 is a graph showing a dependency of threshold voltage on the gate length of each MOSFET in a general CMOS device.

As shown in FIG. 1(a), a n-well 2 doped with a n-type impurity is provided in a region at which a p-MOSFET is to be formed in a semiconductor substrate 1 lightly doped with a p-type impurity. Steps CA1–CA4 (in FIG. 4) are conducted to the semiconductor substrate 1, as well as the conventional steps CX1–CX4 (in FIG. 21). In detail, as shown in FIG. 1(a), a gate electrode 12 composed of an isolation 10, a gate oxide layer 11 and a polysilicon layer is formed. Then, low-dose ion implant of a p-type impurity, $BF_2^+$ ion, is conducted to the entire semiconductor substrate 1 at step CA11 to form $p^-$ regions 5, 5 to be local punch through stoppers of a n-MOSFET. At this time, $p^-$ regions 8, 8 are also formed simultaneously at the p-MOSFET.

As shown in FIG. 1(b), $P^+$ ion is implanted to the entire semiconductor substrate 1 at step CA12 to form $n^-$ regions 7, 7 to be local punch through stoppers of the p-MOSFET. At this time, $n^-$ regions 4, 4 are also formed at the n-MOSFET. Wherein, the order of steps CA11 and CA12 may be interchanged.

Next, annealing is conducted at step CA14. After protective-oxidation is conducted at step CA16, the steps CA17–CA20 are conducted as well as the conventional steps CX17–CX20. In detail, a resist is coated at step CA17, a resist mask 21 open to only the n-MOSFET is formed at step CA18, then high-dose $As^+$ ion implant is conducted at step CA19 to form source/drain regions 3, 3 of the n-MOSFET (see FIG. 2(a)). Subsequently, the resist mask 21 is removed at step CA20. Wherein, the $n^-$ regions 4, 4 may be almost covered with the source/drain regions 3, 3 at the impurity implantation for forming source/drain regions.

Further, at steps CA21–CA24, the same steps as the steps CX21–CX24 in the conventional method are conducted. In detail, the resist is coated at step CA21, the resist mask 22 open to the upper part of the p-MOSFET is formed at step CA22, then high-dose $BF_2^+$ ion implant is conducted to form source/drain regions 6, 6 of the p-MOSFET (see FIG. 2(b)). Then, the resist mask 22 is removed at step CA24. Wherein, the $p^-$ regions 8, 8 may be almost covered with the source/drain region 6, 6 at the impurity implantation for forming source/drain regions.

Figure 8:
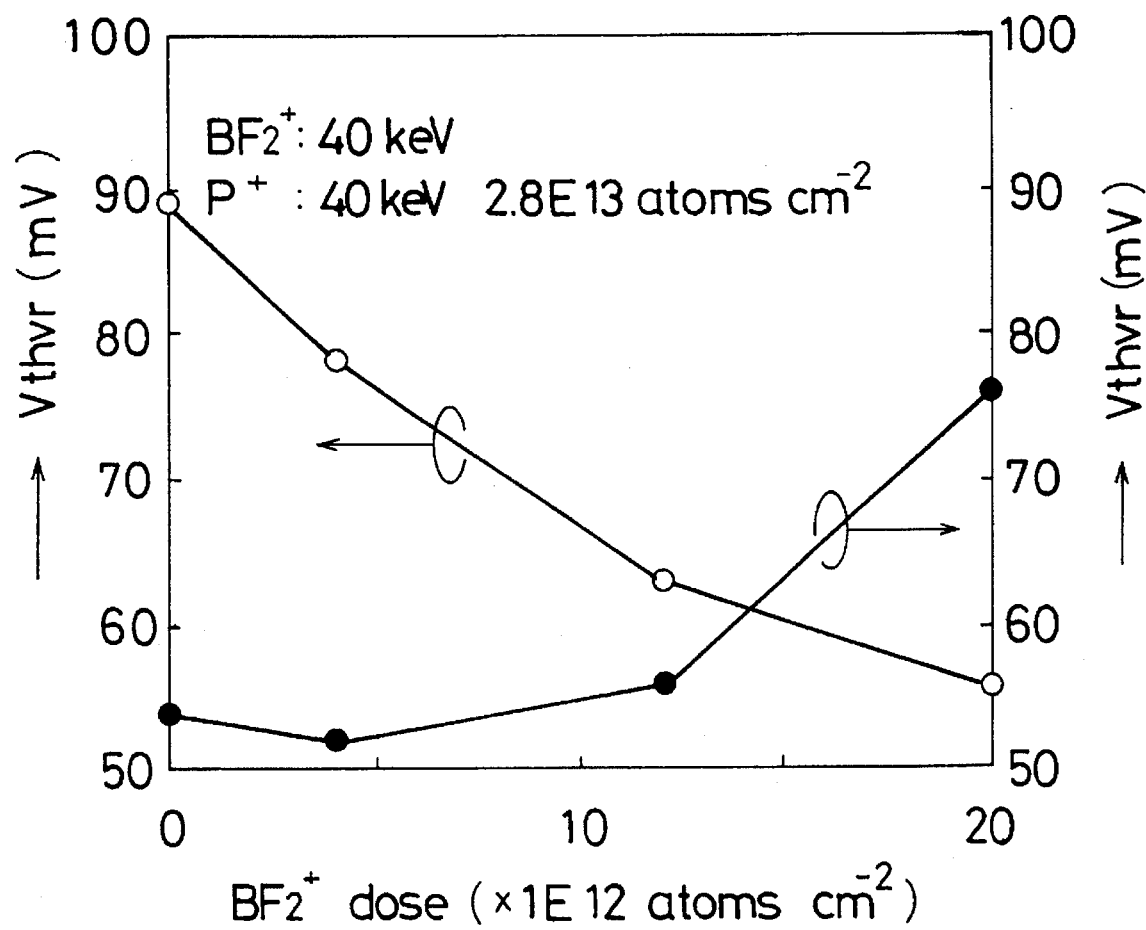
FIG. 8 is a graph showing a correlative relationship between dose of $BF_2^+$ ion and short channel effect Vthvr in the n-MOSFET and p-MOSFET in the second embodiment.

FIGS. 3(a), 3(b) show sections at the respective end parts of the gate electrodes of the n-MOSFET and p-MOSFET which are finally obtained according to the steps CA1–CA24. In the figures, the $p^-$ region 5 to be the local punch through stopper and the $n^-$ region 4 are formed between the source/drain region 3 and the channel region 13 in the n-MOSFET, and the $n^-$ region 7 to be the local punch through stopper and the $p^-$ region 8 are formed between the source/drain region 6 and the channel region 13 in the p-MOSFET. Namely, the regions 5, 7 to be the local punch through stoppers are respectively formed in both of the n-MOSFET and the p-MOSFET. Accordingly, as shown in FIG. 8, the short channel effect is surely prevented in both MOSFETs (inspection is described later). Moreover, comparing FIG. 4 with FIG. 21, this embodiment requires no steps corresponding to CX5–CX10, CX13 and CX15 in the conventional method (i.e., formation and removal of two resist masks), which means that the number of steps in this embodiment is almost equal to that in the method without forming the local punch through stopper. Thus, the number of steps is fairly reduced.

(SECOND EMBODIMENT)

Hereinafter discussed is a method of manufacturing a semiconductor device according to the second embodiment of the present invention, with reference to the drawings. FIGS. 5(a)–5(c) are sections showing respective states of the semiconductor substrate at respective steps for manufacturing the semiconductor device in the second embodiment. FIG. 7 is a flow chart showing the manufacturing steps of the semiconductor device in the second embodiment.

In the second embodiment, the steps CB1–CB14 are identical with the above-mentioned steps CA1–CA14 in the first embodiment, thus the corresponding states of the semiconductor substrate are omitted to show. The state of the semiconductor substrate after the step CB14 is shown in FIG. 1(b). In this embodiment, a 4-step implantation is employed for the $BF2^+$ ion implant under the condition of 7 degree tilt angle, 40 KeV implant energy, and 1.4E13 atmos/$cm^2$ total dose, and a 4-step implantation is employed for the $P^+$ ion implant under the condition of 7 degree tilt angle, 40 KeV implant energy and 2.8E13 atoms/$cm^2$ total dose. The $p^-$ regions 8, 8 in the p-MOSFET serve as LDDs of the p-MOSFET, as described later.

Thereafter, at step CB15, side walls are formed. In detail, as shown in FIG. 5(a), a comparatively thin $SiO_2$ film is formed on the semiconductor substrate and is anisotropically etched to form the side walls 16 on both sides of the gate electrode 12. Then, a protective oxide layer 15 is formed at step CB16, the resist mask 21 open to only the upper part of the n-MOSFET is formed at steps CB17 and CB18, and high-dose $As^+$ ion implant is conducted at step CB19 so that the source/drain regions 3, 3 of the n-MOSFET are formed as shown in FIG. 5(b).

Further, as shown in FIG. 5(c), the resist mask 21 is removed at step CB20, another resist is coated at step CB21, and the resist mask 22 open to only the upper part of the p-MOSFET is formed at step CB22. Then, at step CB23, $BF2^+$ ion implant is conducted to the p-MOSFET to form the source/drain regions 3, 3 of the p-MOSFET. The resist mask 22 is removed at step CB24.

FIGS. 6(a), 6(b) respectively show the states of the end parts of the gate electrodes of the n-MOSFET and p-MOSFET which are formed according to the above steps CB1–CB24. In the figures, the $n^-$ region 4 functioning as the LDD is formed in the n-MOSFET in addition to the $p^-$ region 5 to be the local punch through stopper, and the $n^-$ region 7 to be the local punch through stopper and the $p^-$ region 8 functioning as the LDD are formed in the p-MOSFET.

In this embodiment, the $p^-$ region 5 to be the local punch through stopper is formed also at the n-MOSFET and the $p^-$ region 8 to be the LDD is formed in the p-MOSFET with the same number of the steps with the formation of the resist mask as that of the conventional manufacturing method shown in FIGS. 16(a)–16(d). Thus, in a highly-integrated CMOS device with extremely short gate, the durability to hot carrier is enhanced and the short channel effect is prevented. While the additional step CB15 for forming the side walls is required in this embodiment in contrast with the first embodiment, the reliability is increased by lowering the generation of hot carrier. This means that the second embodiment is more effective than the first embodiment in a further highly-integrated CMOS device.

FIG. 8 shows measured data of short channel effect Vthvr in the n-MOSFET and the p-MOSFET which are manufactured according to a method almost identical with the second embodiment. Wherein, the $P^+$ ion implant at step CB12 is conducted under set conditions of 40 KeV acceleration energy and 2.8E13 atoms/$cm^2$ dose, and dose of $BF2^+$ ion at step CB11 is varied to measure the dependency of short channel effect Vthvr on dose of $BF2^+$ ion. The conditions for measurement are that: 3.3V drain voltage Vd, −1.5V substrate voltage Vsub, and the short channel effect Vthvr determined by a following equation (1) in the n-MOSFET.

$$Vthvr = Vth0.6 - Vth0.54 \quad (1)$$

Wherein, Vth0.6 and Vth0.54 are respectively threshold voltages of n-MOSFETs with 0.6μm and 0.54μm gate lengths.

Further, in the p-MOSFET, the conditions for measurement are that: −3.3V drain voltage Vd, 0V substrate voltage Vsub, and the short channel effect Vthvr determined by a following equation (2).

$$Vthvr = Vth0.7 - Vth0.64 \quad (2)$$

As shown in FIG. 8, the short channel effect in both the n-MOSFET and the p-MOSFET is prevented by the $BF2^+$ ion implant of which dose is within a set range of 1–2E13 atmos/$cm^2$. Especially, the short channel effect is most effectively prevented in both MOSFETs by the $BF2^+$ ion implant of which dose is about 1.4E13 atmos/$cm^2$. In the above embodiment, when the p-type impurity and the n-type impurity are successively, concurrently implanted to each MOSFET, the local punch through stoppers are formed, adjusting the dose thereof. Thus the short channel effect in both MOSFETs are prevented practically.

In a case where a CMOS device without the local punch through stopper in the p-MOSFET is manufactured under the same conditions as the above, 135 mV short channel effect is measured (not shown in FIG. 8). Accordingly, in such a CMOS device with short gate, the short channel effect in the p-MOSFET is remarkably prevented by providing the local punch through stopper.

(THIRD EMBODIMENT)

Figure 12:
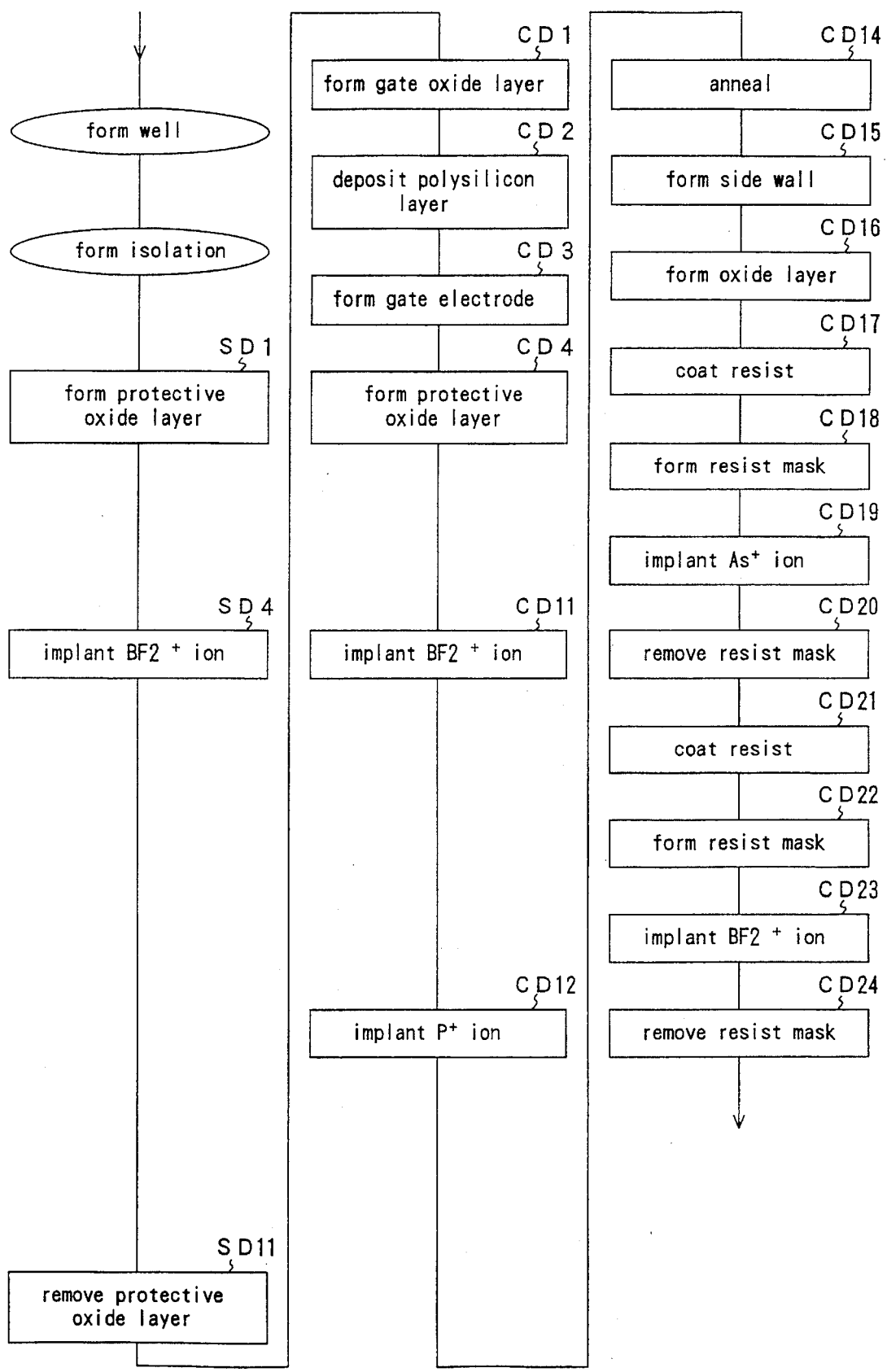
FIG. 12 is a flow chart showing the manufacturing method in the third embodiment.

The third embodiment is described next with reference to FIGS. 9(a), 9(b), 10(a), 10(b), 11(a), 11(b) and 12. FIGS. 9(a), 9(b), 10(a) and 10(b) show respective states of the semiconductor substrate in the manufacturing method of a CMOS device according to the third embodiment. FIGS. 11(a), 11(b) are partial sections respectively showing the end parts of the gate electrodes of the n-MOSFET and the p-MOSFET which are finally obtained. FIG. 12 is a flow chart showing the manufacturing method of the semiconductor substrate in the third embodiment, wherein the steps SD1–SD11 prior to the steps CB1–CB24 in the second embodiment are shown.

After the steps of forming the well 2 and of forming the isolation 10, the protective oxide layer 19 is formed at step SD1, and low-dose $BF2^+$ ion implant is conducted to the active region of the substrate at step SD4, wherein an impurity for controlling threshold value is introduced to the well 2. Thereby, as shown in FIG. 9(a), $p^-$ regions 17, 18 are formed respectively near the surface of the substrate of the n-MOSFET and the p-MOSFET. Further, the protective oxide layer 19 is removed at step SD11, another gate oxide layer 14 is formed at step CD1, then the polysilicon layer is deposited at step CD2. The state of the entire semiconductor substrate is as shown in FIG. 9(b).

Thereafter, the gate electrode is patterned and the protective oxide layer 14 is formed at steps CD3, CD4, and low-dose $BF2^+$ ion implant is conducted at CD11. The semiconductor substrate at this time is as shown in FIG. 10(a). The $p^-$ regions 5, 5 to be the local punch through stoppers are formed at the n-MOSFET, and $p^-$ regions 8, 8 functioning as LDDs are formed at the p-MOSFET. Next, without providing the resist mask, the low-dose $P^+$ ion implant is conducted according to a four-step large tilt angle (about 25°) ion implant method at step CD12. Thereby, $n^-$ regions 4, 4 to be LDDs are formed at the n-MOSFET, and $n^-$ regions 7, 7 to be the local punch through stoppers are formed at the p-MOSFET. At this time, the $n^-$ regions 4, 7 are extended under the gate electrode 12 by the large tilt angle $P^+$ ion implant. Wherein, the implantation may not be according to the large tilt angle ion implant method.

Subsequently, at steps CD14–CD24, the same steps as the steps CB14–CB24 in the second embodiment are conducted. The steps CD14–CD24 are identical with the steps CB14–CB24 in the second embodiment, thus the states are omitted to show. Wherein, the side walls 16 are provided in this embodiment. As a result, the structures at the end parts of the gate electrodes of the n-MOSFET and the p-MOSFET are respectively as shown in FIGS. 11(a), (b). In detail, the p$^{--}$ region 17 serves as the channel at the n-MOSFET, and the boundary part between the p$^{--}$ region 18 and the well 2 (not the p$^{--}$ region 18) serves as the channel at the p-MOSFET. In other words, the p-MOSFET is a buried channel type MOSFET and the n-MOSFET is a surface channel type MOSFET. Wherein, the p$^{-}$ region 5 serves as the local punch through stopper in the n-MOSFET, and the n$^{-}$ region 7 serves as the punch through stopper in the p-MOSFET.

Figure 20:
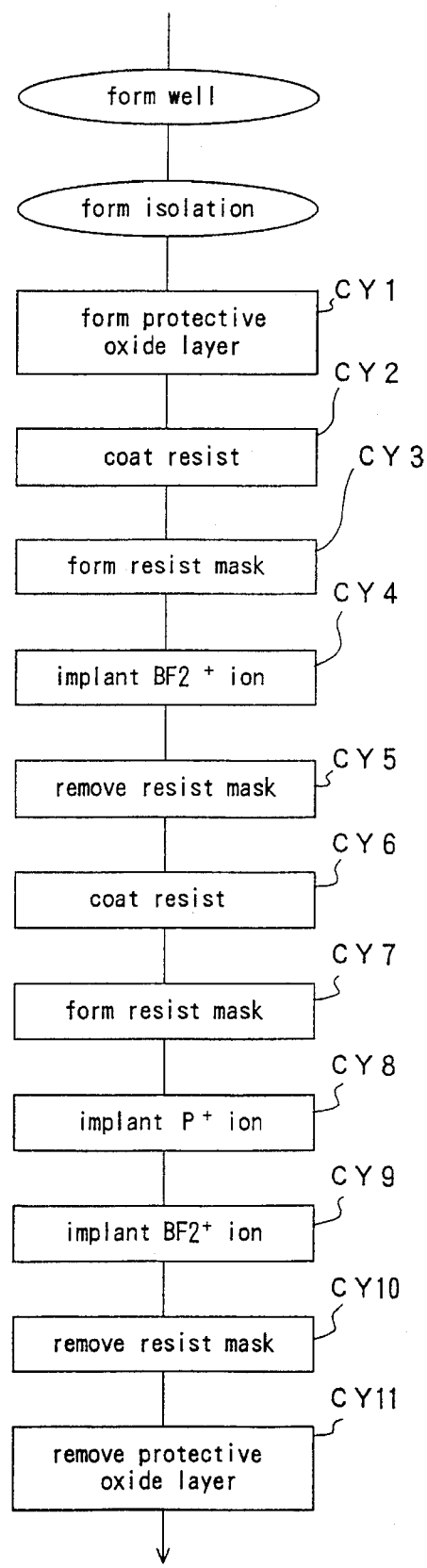
FIG. 20 is a flow chart showing steps before the formation of the gate electrode in the conventional manufacturing method of a CMOS device with the local punch through stoppers at each MOSFET.

According to the third embodiment, the n-MOSFET is formed as the surface channel type MOSFET and the p-MOSFET is formed as the buried channel type MOSFET, thereby well known effects such that the impurity doped to each gate electrode 12 is the n-type impurity are obtained. The implantation of impurity for controlling threshold value in order to form the channel of the n-MOSFET requires only one time of the step SD4. Namely, though the steps for formation and removal of two resist masks are required for introducing the impurity for controlling threshold value into the channel regions of both MOSFETs in the conventional method shown in FIG. 20, the ion implantation of the impurity is concurrently conducted at one time to each MOSFET in this embodiment. Thus, the eight steps of CY2, CY3, CY5, CY6, CY7, CY8, CY9 and CY10 are unnecessary, which means further reduction of the steps.

(FOURTH EMBODIMENT)

Figure 14:
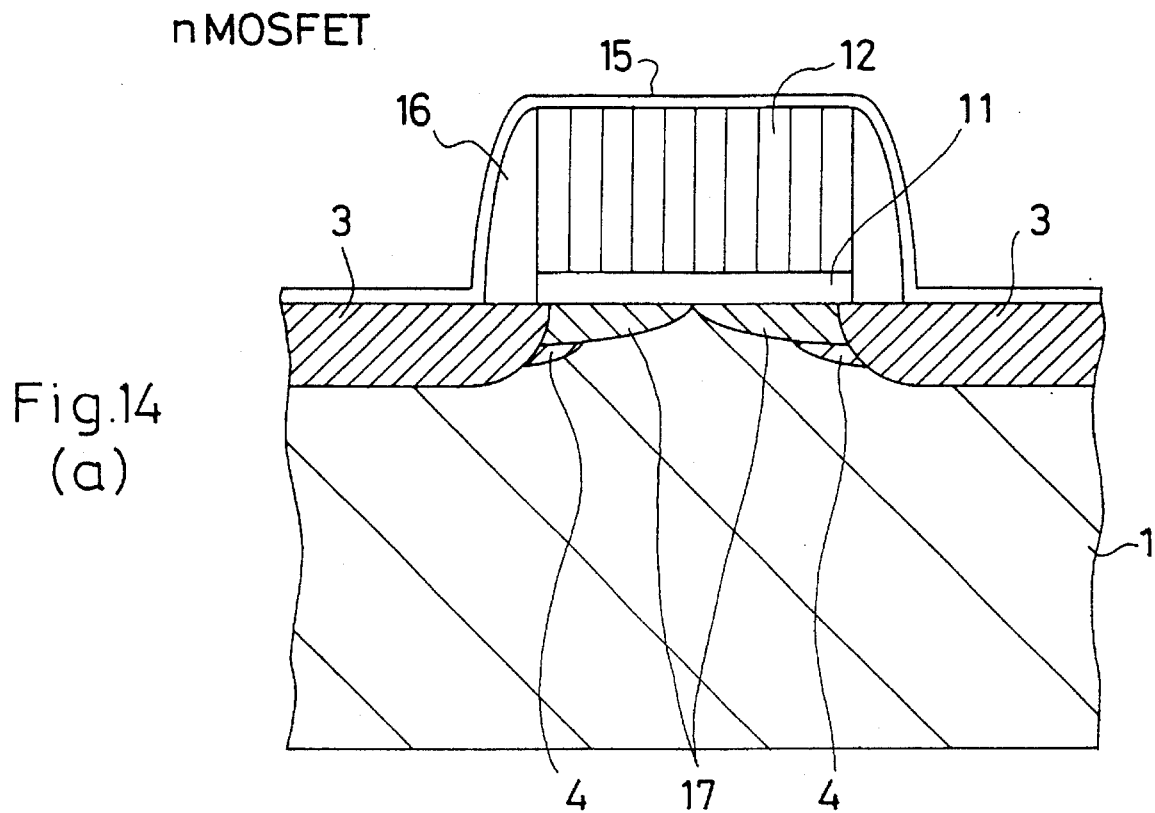
FIGS. 14(a), 14(b) are sections respectively showing parts near the gate electrodes of n-MOSFET and p-MOSFET which are finally obtained according to the fourth embodiment.
Figure 14:
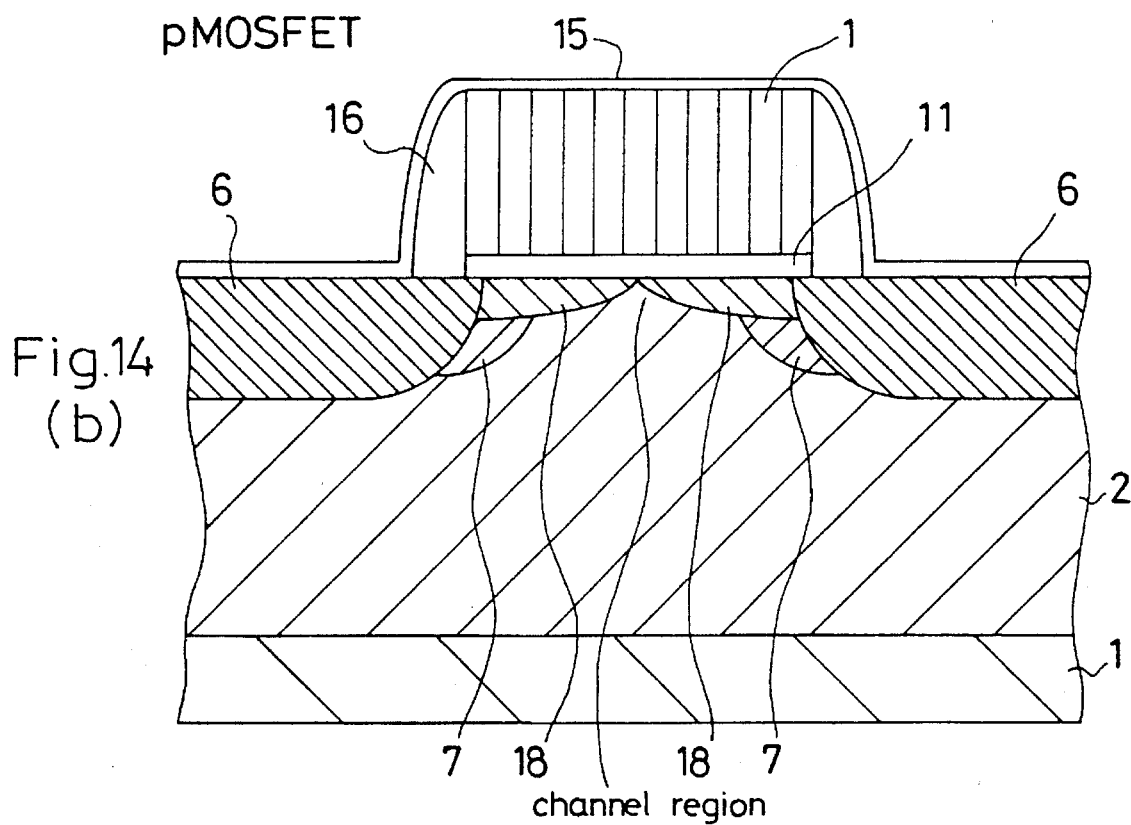
Figure 15:
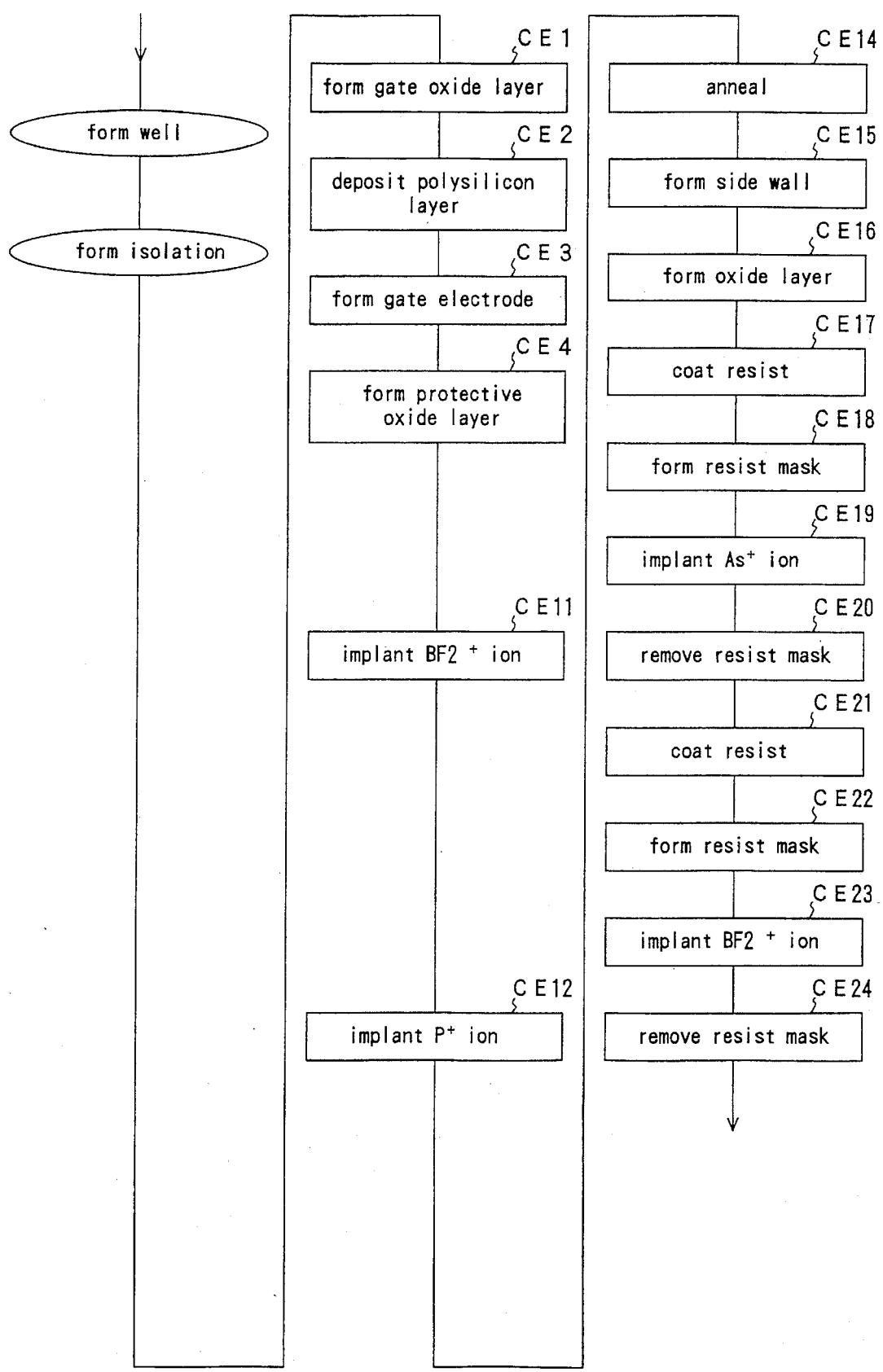
FIG. 15 is a flow chart showing the manufacturing method in the fourth embodiment.

The fourth embodiment is discussed next with reference to FIGS. 13(a)–13(c), 14(a), 14(b) and 15. FIGS. 13(a)–(c) show respective states of the semiconductor substrate in the manufacturing method of the CMOS device according to the fourth embodiment. FIGS. 14(a), (b) are partial sections respectively showing the end parts of tile gate electrodes of the n-MOSFET and the p-MOSFET which are finally obtained. FIG. 15 is a flow chart showing the manufacturing method of the semiconductor device in the fourth embodiment.

In the fourth embodiment, after the well 2 and the isolation 10 are formed, the gate oxide layer 11, the gate electrode 12 and the protective oxide layer 14 are formed at steps CE1–CE4 without ion implantation of impurity for controlling threshold value. The semiconductor substrate at this time is as shown in FIG. 13(a), in which the impurity for controlling threshold value is introduced to the well 2, but no region doped with the impurity for controlling threshold value exists in the n-MOSFET. Then, low-dose BF2$^+$ ion implant is conducted at step CE11 according to the four-step large tilt angle (about 50°) ion implant method (see FIG. 13(b)). Then at step CE12, low-dose p$^+$ ion implant is conducted according to the four-step large tilt angle (about 45°) ion implant method. The semiconductor substrate at this time is as shown in FIG. 13(c), in which p$^{--}$ regions 17, 18 which are extended below the gate electrode 12 and n$^-$ regions 4, 7 are formed in each MOSFET.

Subsequently, the same steps as CB14–CB24 in the second embodiment are conducted at steps CE14–CE24. In this embodiment, the side walls 16 are provided. As a result, the end parts of the gate electrodes of the n-MOSFET and the p-MOSFET are respectively as shown in FIG. 14(a), 14(b). In detail, by the annealing at the step CE14, the boron ions in the p$^{--}$ regions 17, 18 are diffused from both sides to be connected to each other at the middle under the gate in each MOSFET. Wherein, the p$^{--}$ regions 17, 18 are not required to be connected to each other in the n-MOSFET. Namely, as well as in the third embodiment, the p$^{--}$ region 17 serves as the channel in the n-MOSFET, and the boundary part between the p$^{--}$ region 18 and the well 2 (not the p$^{--}$ region 18) serves as the channel in the p-MOSFET. The p-MOSFET is a buried channel type MOSFET and the n-MOSFET is a surface channel type MOSFET. Wherein, the p$^-$ region 5 functions as the local punch through stopper in the n-MOSFET, and the n$^-$ region 7 functions as the local punch through stopper in the p-MOSFET.

In the fourth embodiment, compared with the third embodiment, the step SD4 (BF2$^+$ ion implantation) in FIG. 12 is unnecessary, which reduces the steps SD1, SD11. Thus, the number of steps is further reduced.

We claim:

1. A method of manufacturing a CMOS transistor with a n-MOSFET and a p-MOSFET on a semiconductor substrate, comprising the steps of:

introducing an impurity for controlling threshold value into at least a part to be a channel region of the n-MOSFET of the semiconductor substrate;

introducing an impurity for controlling threshold value into at least a part to be a channel region of the p-MOSFET of the semiconductor substrate;

forming a gate electrode of the n-MOSFET and a gate electrode of the p-MOSFET on the semiconductor substrate;

conducting low-dose ion implant of a p-type impurity to both of the n-MOSFET and the p-MOSFET, using the gate electrodes of the n-MOSFET and the p-MOSFET as masks to form p$^-$ regions;

conducting low-dose ion implant of a n-type impurity to both of the n-MOSFET and the p-MOSFET, using the gate electrodes of the n-MOSFET and the p-MOSFET as masks to form n$^-$ regions;

forming source/drain regions at the n-MOSFET by heavily introducing a n-type impurity after the steps of low-dose ion implant of the p-type and n-type impurities; and forming source/drain regions at the p-MOSFET by heavily introducing a p-type impurity after the steps of low-dose ion implant of the p-type and n-type impurities, wherein p$^-$ regions to be local punch through stoppers are formed between the source/drain regions and the channel region of the n-MOSFET, and n$^-$ regions to be local punch through stoppers are formed between the source/drain regions and the channel regions of the p-MOSFET.

2. The method of manufacturing a CMOS semiconductor of claim 1, further comprising the step of forming side walls at both sides of each gate electrode after the low-dose ion implant of the p-type and n-type impurities and before the formation of the source/drain regions of each MOSFET, wherein n$^-$ regions to be LDDs are formed between the source/drain regions and the channel region of the n-MOSFET, and p$^-$ regions to be LDDs are formed between the source/drain regions and the channel region of the p-MOSFET.

3. The method of manufacturing a CMOS semiconductor device of claim 1 or 2, wherein, at the steps of low-dose ion implant of the p-type and n-type impurities, respective ion doses of the p-type impurity and the n-type impurity are adjusted so that respective lowerings of threshold voltages of the n-MOSFET and the p-MOSFET, which are accompanied by the introduction of each impurity, are almost equal to each other.

4. The method of manufacturing a CMOS semiconductor device of claim 1 or 2, further comprising the step of forming a well at a region where a first MOSFET being either the n-MOSFET or the p-MOSFET is to be formed, wherein at the step of introducing the impurity for controlling threshold value, ion implantation is conducted to the surface of active regions of both of the n-MOSFET and the p-MOSFET before the formation of the gate electrodes of both MOSFETs, such that in the first MOSFET, a buried channel region is formed in the well.

5. The method of manufacturing a CMOS semiconductor device of claim 3, further comprising the step of forming a well at a region where a first MOSFET being either the n-MOSFET or the p-MOSFET is to be formed, wherein at the step of introducing the impurity for controlling threshold value, ion implantation is conducted to the surface of active regions of both of the n-MOSFET and the p-MOSFET before the formation of the gate electrodes of both MOSFETs such that, in the first MOSFET, a buried channel region is formed in the well.

6. The method of manufacturing a CMOS semiconductor device of claim 1 or 2, further comprising the step of forming a well at a region where a first MOSFET being either the n-MOSFET or the p-MOSFET is to be formed, wherein at least the step of heavily introducing of the impurity of same polarity as that in the source/drain regions of the other MOSFET, a second MOSFET, out of the steps of low-dose ion implant of the p-type impurity and of low-dose ion implant of the n-type impurity is conducted according to a large tilt angle ion implant method with at least two steps such that, in the first MOSFET, a buried channel region is formed in the well.

7. The method of manufacturing a CMOS semiconductor device of claim 3, further comprising the step of forming a well at a region where a first MOSFET being either the n-MOSFET or the p-MOSFET is to be formed, wherein at least the step of ion implant of the impurity of same polarity as that in the source/drain regions of the other MOSFET, a second MOSFET, out of the steps of low-dose ion implant of the p-type impurity and of low-dose ion implant of the n-type impurity is conducted according to a large tilt angle ion implant method with at least two steps such that, in the first MOSFET, a buried channel region is formed in the well.

8. The method of manufacturing a CMOS semiconductor device of claim 6, wherein the large tilt angle ion implant method comprises an angle of ion implantation ranging from 15 to 60 degrees.

9. The method of manufacturing a CMOS semiconductor device of claim 7, wherein the large tilt angle ion implant method comprises an angle of ion implantation ranging from 15 to 60 degrees.

* * * * *

UNITED STATES PATENT AND TRADEMARK OFFICE
CERTIFICATE OF CORRECTION

PATENT NO. : 5,500,379
DATED : March 19, 1996
INVENTOR(S) : Odake, et. al.

It is certified that error appears in the above-identified patent and that said Letters Patent is hereby corrected as shown below:

Column 1, line 13, change "tile" to --the--.

Column 2, line 53, change "tile" to --the--.

Column 10, line 45, change "p⁻" to --p⁻ ⁻--.

Column 11, line 9, change "p⁻" to --p⁻ ⁻--;
        line 10, change "p⁻" to --p⁻ ⁻--;
        line 11, change "p⁻" to --p⁻ ⁻--;
        line 39, change "tile" to --the--;
        line 58, change "p⁻" to --p⁻ ⁻--; and
        line 67, change "p⁻" to --p⁻ ⁻--.

Column 12, line 2, change "p⁻" to --p⁻ ⁻--;
        line 4, change "p⁻" to --p⁻ ⁻--;
        line 6, change "p⁻" to --p⁻ ⁻--; and
        line 7, change "p⁻" to --p⁻ ⁻--.

Signed and Sealed this

Thirtieth Day of May, 2000

Attest:

Q. TODD DICKINSON

*Attesting Officer*      *Director of Patents and Trademarks*